United States Patent
Chen

(10) Patent No.: US 11,605,970 B2
(45) Date of Patent: Mar. 14, 2023

(54) PERSISTENT DC POWER AND CONTROL SWITCH

(71) Applicant: Entrantech Inc., Gilroy, CA (US)

(72) Inventor: Kong-Chen Chen, Gilroy, CA (US)

(73) Assignee: Entrantech Inc., Gilroy, CA (US)

( * ) Notice: Subject to any disclaimer, the term of this patent is extended or adjusted under 35 U.S.C. 154(b) by 0 days.

(21) Appl. No.: 17/667,457

(22) Filed: Feb. 8, 2022

(65) Prior Publication Data

US 2022/0158482 A1     May 19, 2022

Related U.S. Application Data

(63) Continuation-in-part of application No. 17/402,435, filed on Aug. 13, 2021, and a continuation-in-part of application No. 17/398,355, filed on Aug. 10, 2021, now Pat. No. 11,489,455.

(60) Provisional application No. 63/065,341, filed on Aug. 13, 2020.

(51) Int. Cl.
| | |
|---|---|
| H02J 9/06 | (2006.01) |
| H03K 17/56 | (2006.01) |
| H03K 19/20 | (2006.01) |
| H02J 3/02 | (2006.01) |
| H02J 3/38 | (2006.01) |
| H02J 7/35 | (2006.01) |

(52) U.S. Cl.
CPC .............. *H02J 9/061* (2013.01); *H02J 3/02* (2013.01); *H02J 3/381* (2013.01); *H03K 17/56* (2013.01); *H03K 19/20* (2013.01); *H02J 7/35* (2013.01); *H02J 2300/22* (2020.01); *H02J 2300/28* (2020.01)

(58) Field of Classification Search
CPC ........................................................ H02J 9/061
USPC ............................................................ 307/65
See application file for complete search history.

(56) References Cited

U.S. PATENT DOCUMENTS

| | | |
|---|---|---|
| 5,786,642 A | 7/1998 | Wilhelm |
| 6,320,359 B1 | 11/2001 | Nagaya et al. |
| 6,798,666 B1 | 9/2004 | Alexander et al. |
| 8,148,844 B2 | 4/2012 | Pan |
| 10,840,735 B1 | 11/2020 | Cooper |
| 11,183,851 B1 | 11/2021 | Chen |
| 11,489,455 B2 | 11/2022 | Chen |
| 2004/0085043 A1 | 5/2004 | Germagian et al. |
| 2005/0225955 A1 | 10/2005 | Grebenkemper et al. |
| 2005/0237724 A1 | 10/2005 | Fiorentino et al. |
| 2006/0244620 A1 | 11/2006 | Sotiriou |
| 2011/0053394 A1 | 3/2011 | Hood, III et al. |

(Continued)

OTHER PUBLICATIONS

International Search Report & Written Opinion dated May 3, 2022 (ISA/US) in PCT Application PCT/US2021/059792.

(Continued)

*Primary Examiner* — Joseph Chang
(74) *Attorney, Agent, or Firm* — Weaver Austin Villeneuve & Sampson LLP

(57) ABSTRACT

A DC switch with embedded de-multiplexing function links a plurality of DC switches in a priority chain and enables concurrent power switching between DC switches. The priority chain automatically selects a most cost-effective power for output to optimize energy utilization efficiency and with a just-in-time enable to activate standby-power to minimize energy waste in persistent DC power.

29 Claims, 12 Drawing Sheets

An Exemplary Type-1 DC Switch in PMOS-FET with Embedded De-Multiplexing Control

(56) References Cited

U.S. PATENT DOCUMENTS

| | | | |
|---|---|---|---|
| 2012/0118602 A1 | 5/2012 | Remmert | |
| 2013/0015714 A1 | 1/2013 | Kwok | |
| 2015/0022001 A1* | 1/2015 | Goei | H02J 7/0068 |
| | | | 307/65 |
| 2015/0048767 A1 | 2/2015 | Takezawa | |
| 2015/0054343 A1 | 2/2015 | Cui | |
| 2015/0348733 A1 | 12/2015 | Shi et al. | |
| 2018/0212420 A1 | 7/2018 | Chen | |
| 2018/0226797 A1* | 8/2018 | Galin | G05F 1/66 |
| 2019/0081571 A1* | 3/2019 | Chung | H02M 7/219 |
| 2022/0014014 A1 | 1/2022 | Chen | |
| 2022/0052618 A1 | 2/2022 | Chen | |
| 2022/0052619 A1 | 2/2022 | Chen | |

OTHER PUBLICATIONS

U.S. Corrected Notice of Allowance dated Oct. 6, 2022 in U.S. Appl. No. 17/398,355.
U.S. Corrected Notice of Allowance dated Sep. 20, 2022 in U.S. Appl. No. 16/950,882.
U.S. Notice of Allowance dated Jun. 9, 2022 in U.S. Appl. No. 16/950,882.
U.S. Appl. No. 17/402,450, Inventor Chen K.C., filed Aug. 13, 2021.
U.S. Corrected Notice of Allowance dated Jul. 18, 2022 in U.S. Appl. No. 17/398,355.
U.S. Corrected Notice of Allowance dated Jun. 21, 2022 in U.S. Appl. No. 16/950,882.
U.S. Non-Final office Action dated Aug. 24, 2022 in U.S. Appl. No. 17/402,435.
U.S. Notice of Allowance dated Jul. 7, 2022 in U.S. Appl. No. 17/398,355.
U.S. Notice of Allowance dated Feb. 15, 2022 in U.S. Appl. No. 16/950,882.
U.S. Notice of Allowance dated Jul. 27, 2021 in U.S. Appl. No. 17/062,413.
U.S. Final office Action dated Jan. 19, 2023 in U.S. Appl. No. 17/402,435.
U.S. Non-Final office Action dated Dec. 27, 2022 in U.S. Appl. No. 17/402,450.

* cited by examiner

FIG. 1 An Exemplary Type-1 DC Switch in PMOS-FET with Embedded De-Multiplexing Control
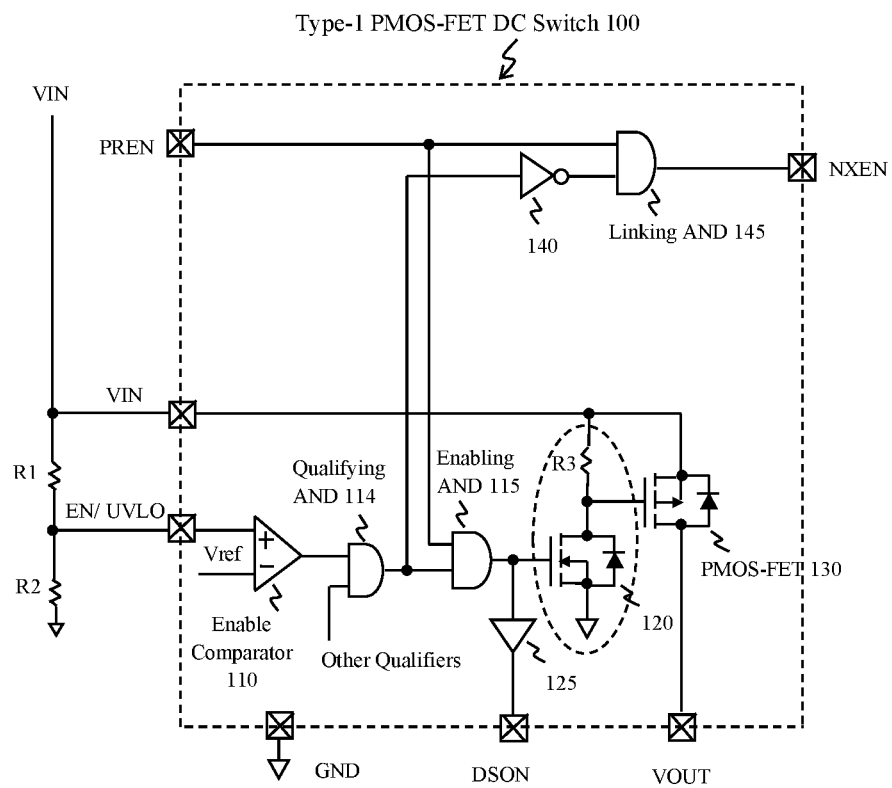

FIG. 2 An Exemplary Type-1 DC Switch in NMOS-FET with Embedded De-Multiplexing Control
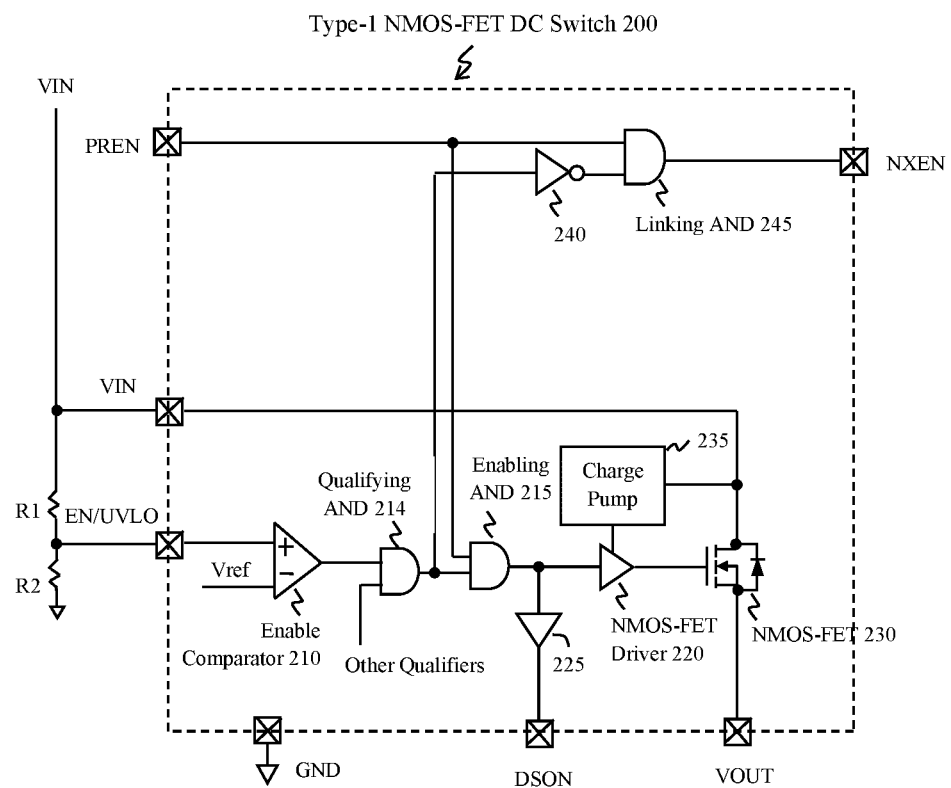

FIG. 3 An Exemplary Type-2 DC Switch in PMOS-FET with Embedded De-Multiplexing Control
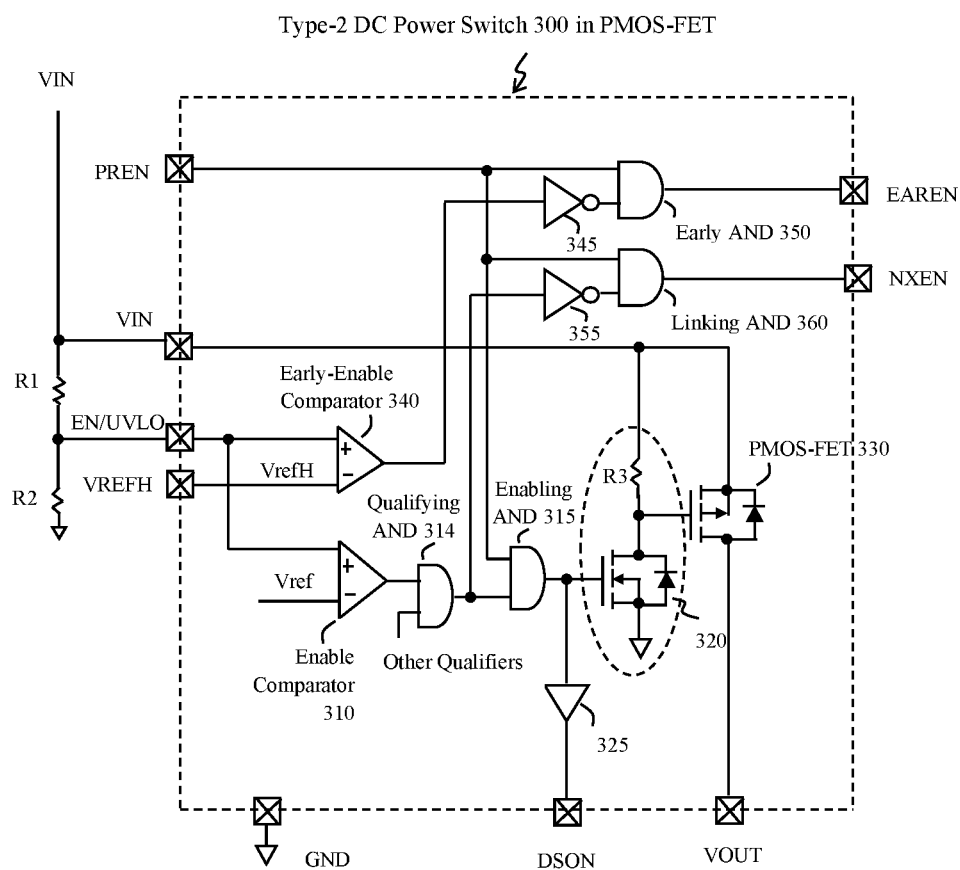

FIG. 4  Another Exemplary Type-2 DC Switch in PMOS-FET with Embedded De-Multiplexing Control
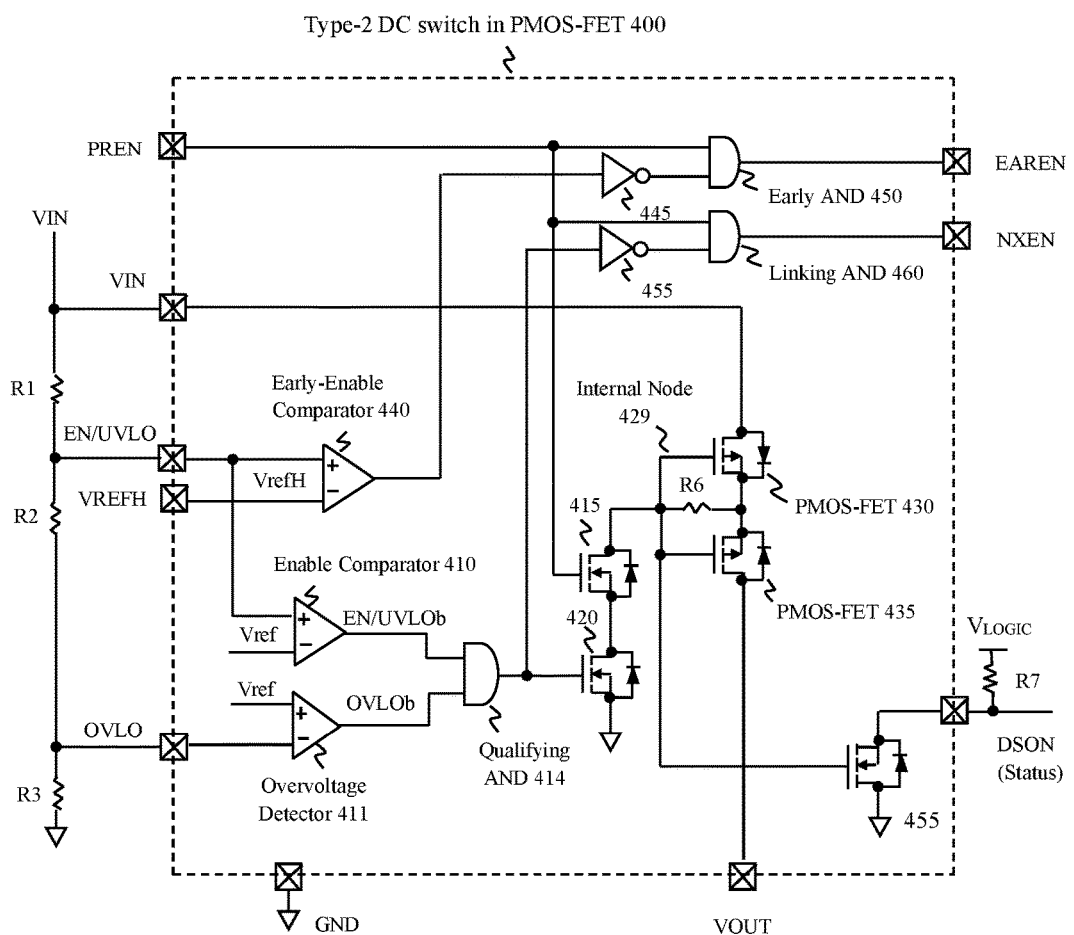

FIG. 5 An Example of Type-2 DC Switch in NMOS-FET with Embedded De-Multiplexing Control
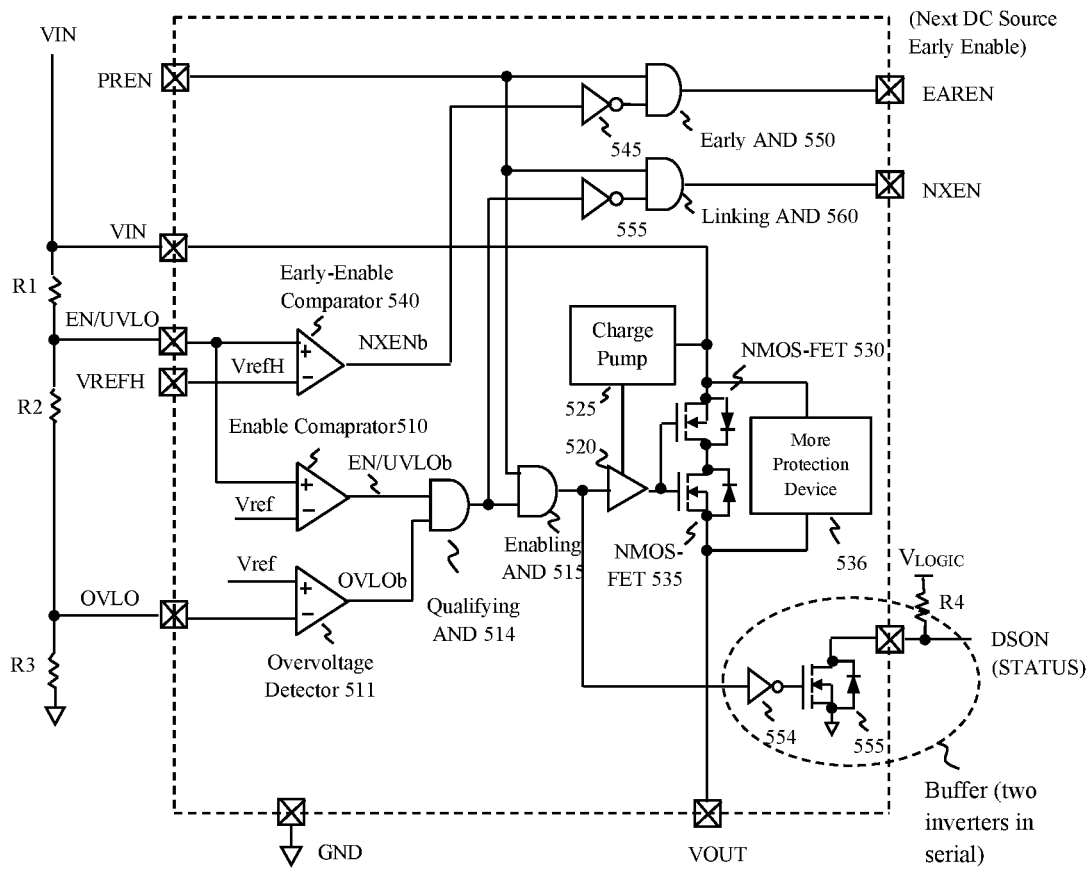

FIG. 6 An Exemplary DC Power Priority Chain Configured with Type-1 DC Switches
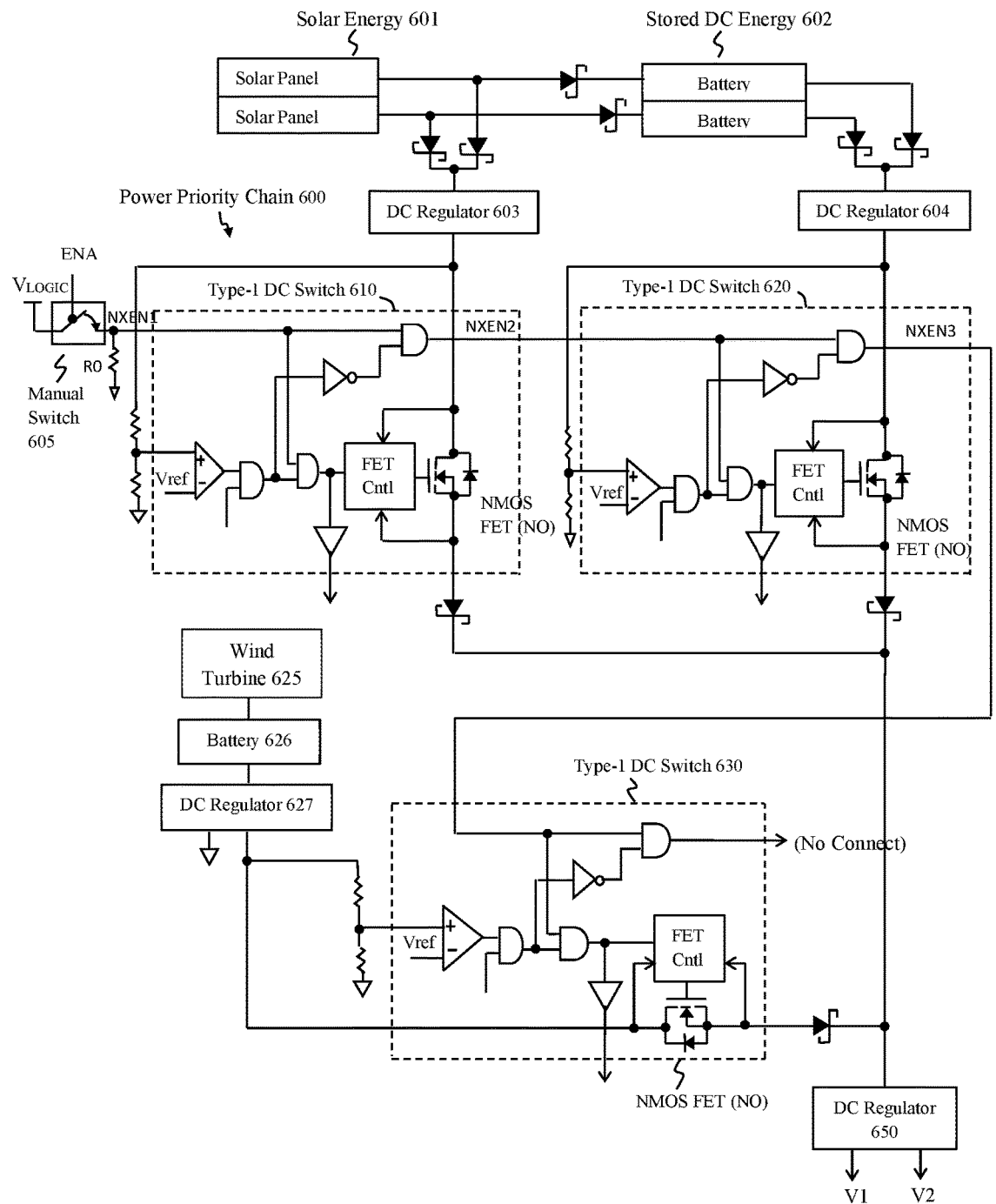

FIG. 7 An Exemplary DC Power Priority Chain Configured with Type-2 DC Switches
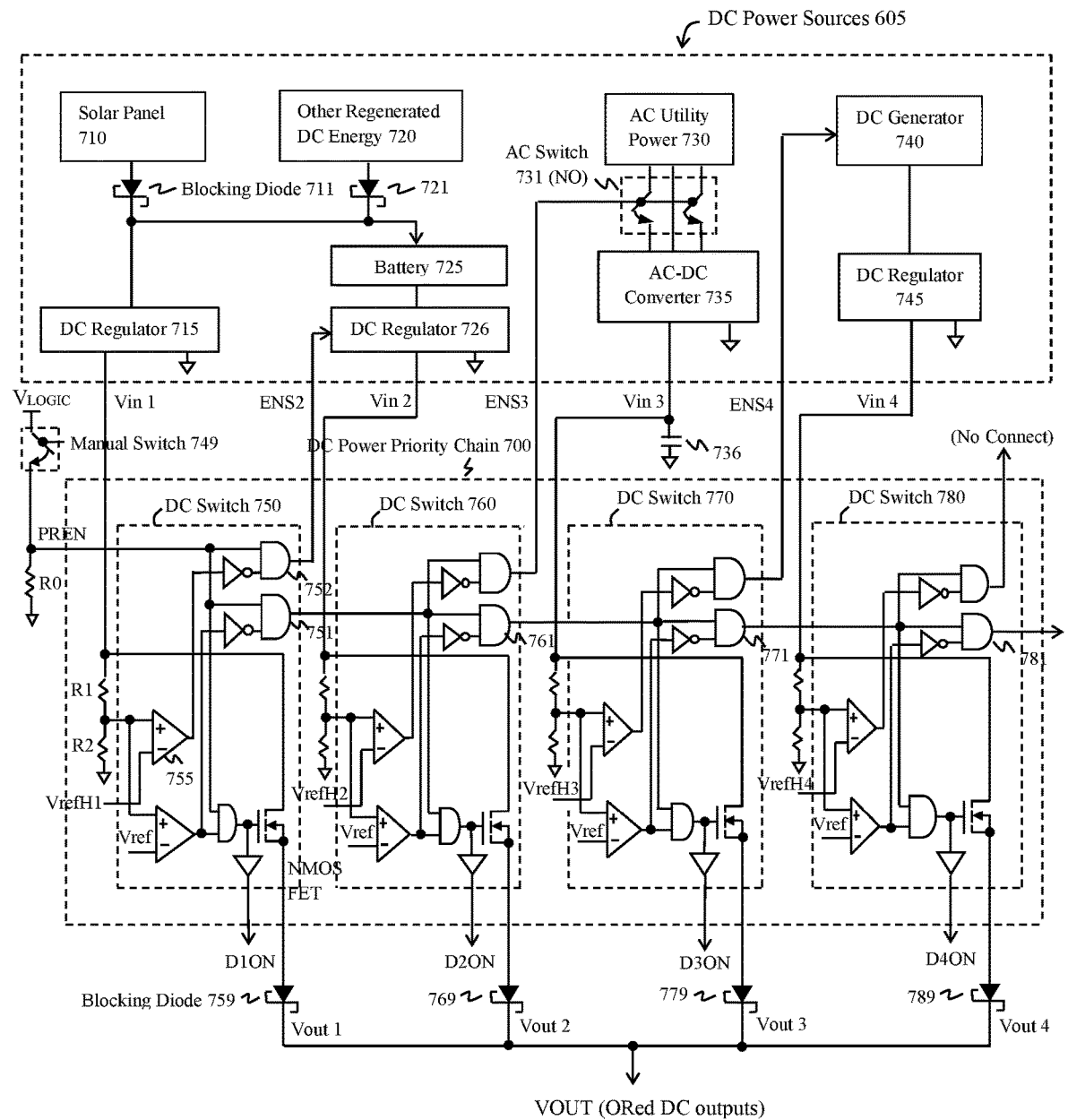

FIG. 8  An Exemplary AC-DC Convertible Power Panel
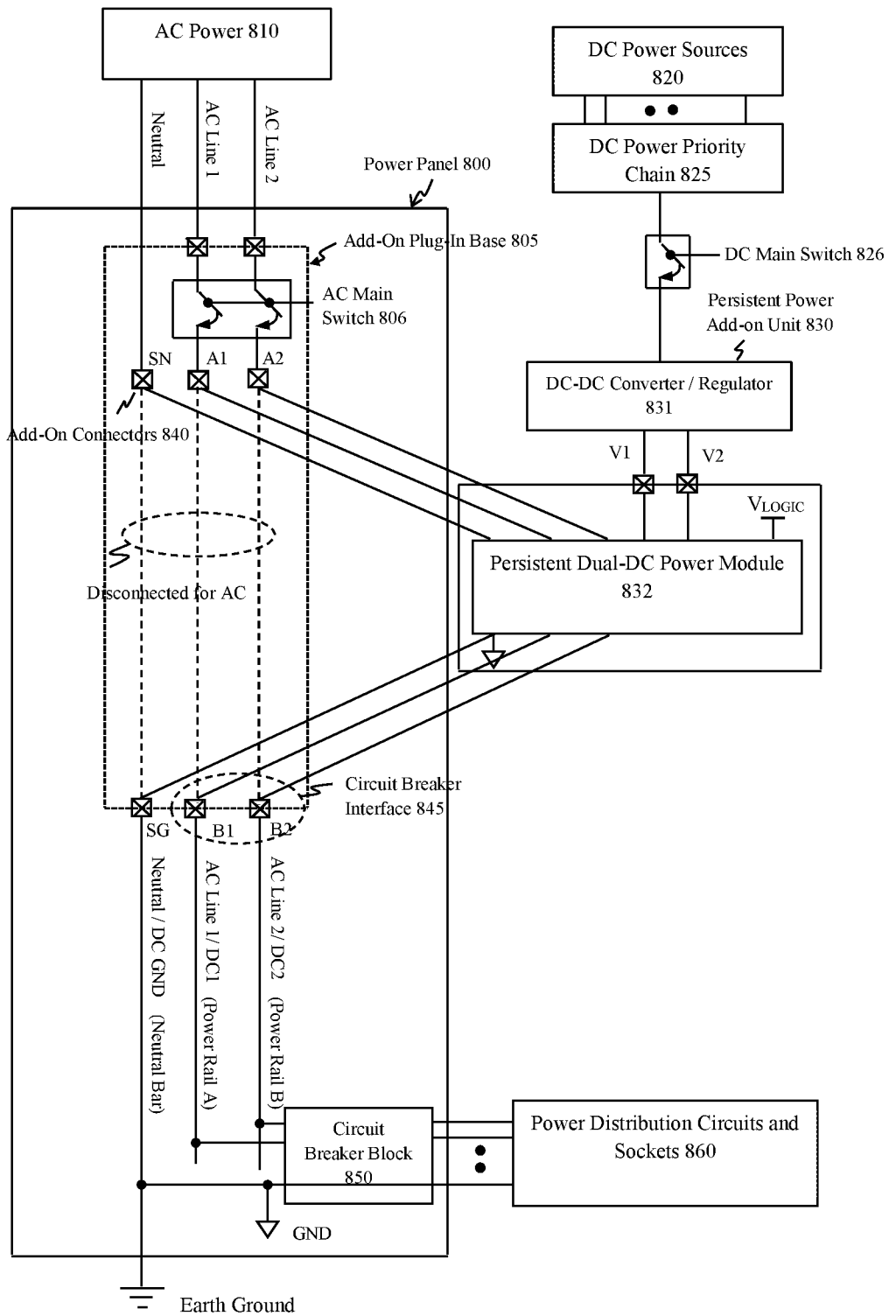

FIG. 9  An Exemplary Configuration of a Persistent Dual-DC Power Module
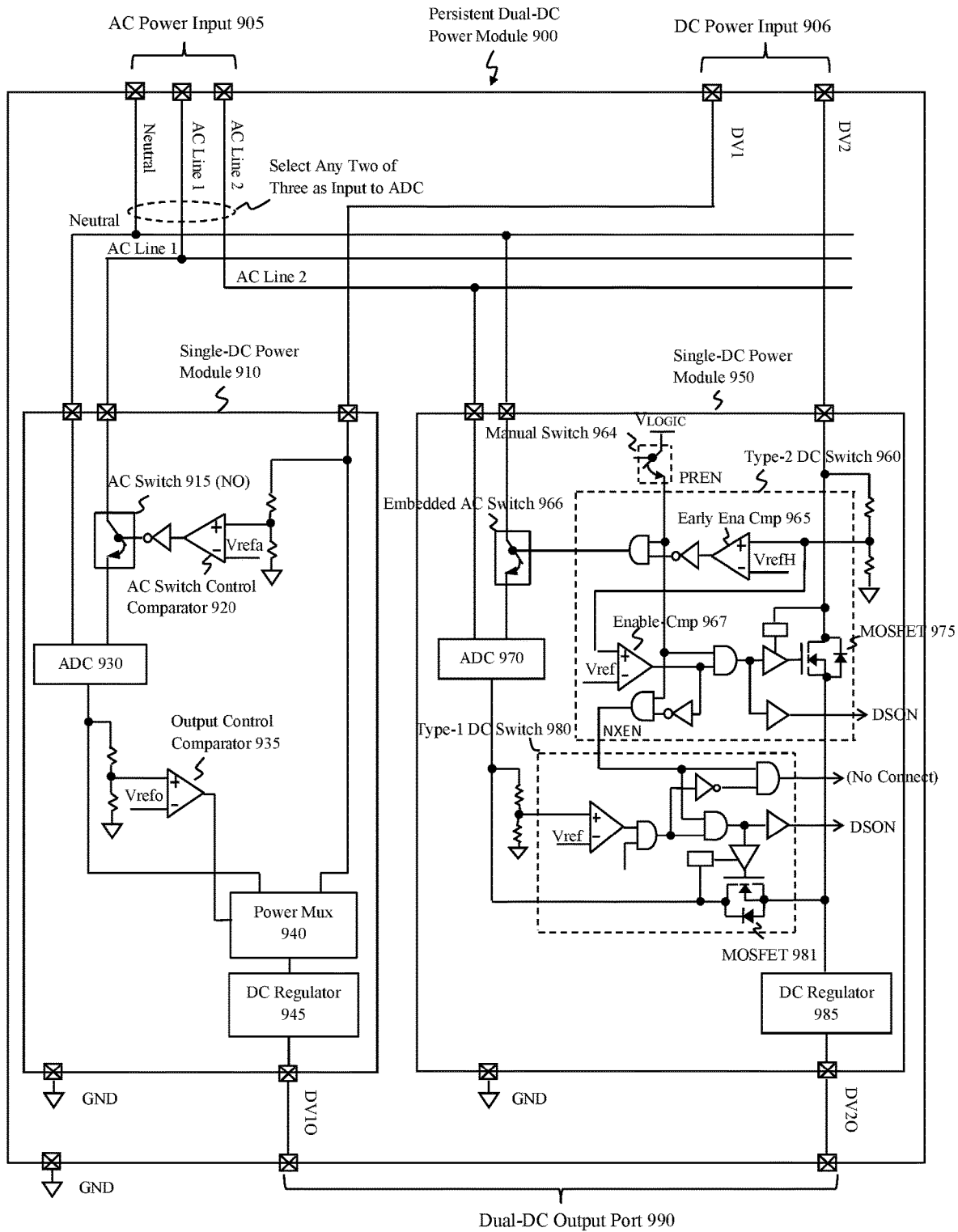

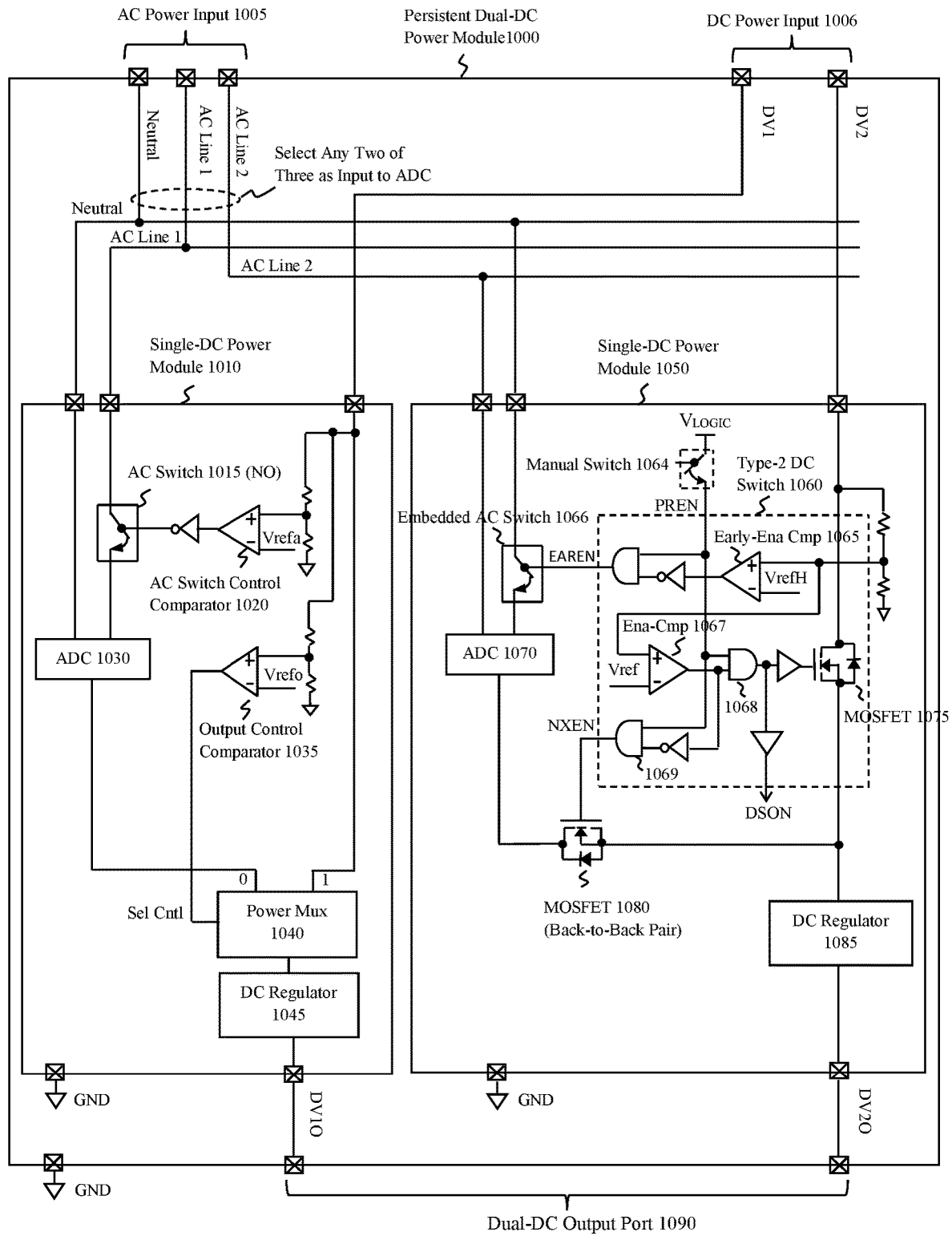
FIG. 10 Another Exemplary Configuration of a Persistent Dual-DC Power Module

FIG. 11  An Exemplary Circuit Breaker with Persistent DC Power Output
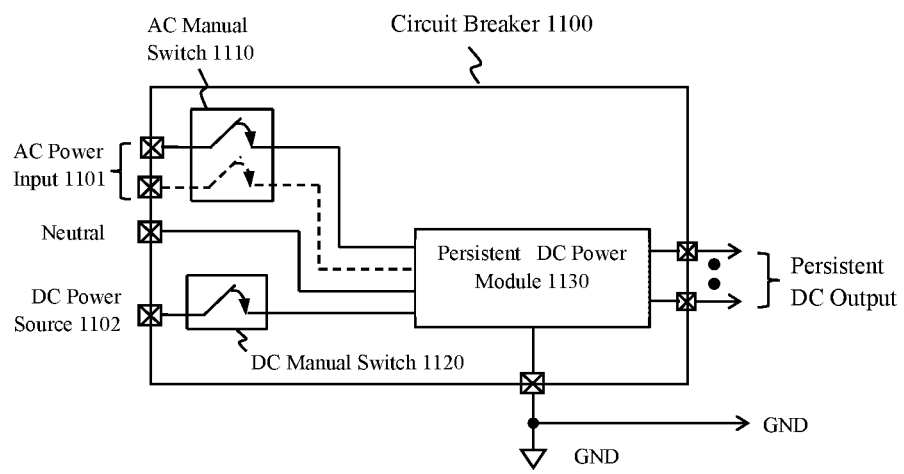

FIG. 12 A Functional Block Representation of DC Power Switch
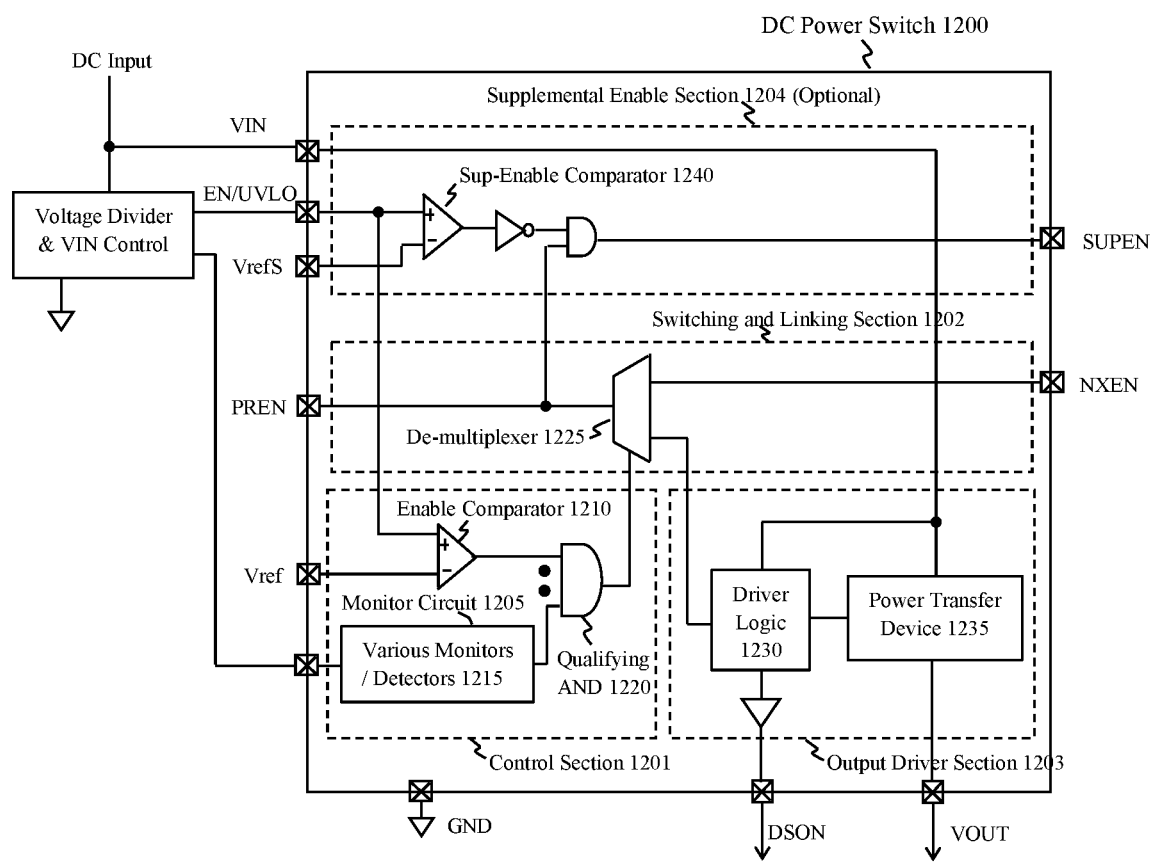

PERSISTENT DC POWER AND CONTROL SWITCH

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD OF THE INVENTION

The present invention is related to an apparatus and method for configuring a persistent DC power with DC power control switch.

BACKGROUND

In a DC ubiquitous environment, a reliable DC power is essential. It is desirable to have a simple and effective method to integrate all available powers efficiently into a persistent DC power.

DC power sources, such as solar panels, wind turbines, battery, DC power generator, or AC converted DC power are abundant. Often, the same type of DC power, such as wind power generated by multiple wind turbines, may be intermittent due to locations or blade orientations. At times battery banks may be used up. Solar energy may also be inconsistent due to cloudy weather. The detection of available powers, the optimization in power usage to lower energy cost, and a smooth transition among various power resources are highly sought-after.

DC power switches, or load switches, are often used in power multiplexing, or power switching. The power switching may be done manually or automatically. Majority of DC power switches are optimized for multiplexing between a main power and a backup power. However, few are designed to multiplex more than two DC powers without using an external control to select or enable a power output.

There are methods to multiplex more than two DC power sources for output. The simplest method is to OR the group of DC powers together. This may be done by connecting a DC power switch, interchangeably named as a DC switch, to each DC power source and then ORing the output of the DC switches into a single output. A reverse current blocking device, such as a Schottky diode, may be connected at the output of each DC switch to prevent reverse current from flowing back to respective power source, in case there is a voltage difference among the group of power sources. One drawback of the ORing approach is that the highest voltage source dominates the output.

Another method to control the operation of multiple DC power sources is to use a micro-controller to enable one for output among a group of DC switches. However, the programming of micro-controller and the interconnections between micro-controller and DC switches would become more complicated as the number of DC switches increases.

SUMMARY

In accordance with one embodiment of the present disclosure, a DC power priority chain is used to optimize power utilization and to ensure a seamless power transition among a group of DC power resources. A group of available DC powers are connected to the group of DC switches respectively. A power priority chain is formed by linking a group of DC switches in series, where a prior DC switch has higher priority than a tail switch. The lowest cost DC power source is connected to the first DC switch, which has the highest priority. Each of other available DC powers is connected to a DC switch in the priority chain in an ascending order based on its energy cost. A DC power source connected to the last DC switch is the most expensive one and is the lowest priority power to be used.

In one embodiment, a DC switch for use in a power priority chain includes a linking section, a power comparison and fault detection section, a power transfer device, and the power transfer control section, where the linking section and the power transfer control section can be combined into a de-multiplexing section controlled by the output of the power comparison and fault detection section.

The power transfer device in the DC switch may be selected from NMOS Field Effect Transistor (NMOS-FET), PMOS-FET, bipolar junction transistor (BJT), electromechanical relay (EMR), solid-state relay (SSR), electric-controllable mechanical switch, or even an integrated-circuits (IC), such as an e-fuse. Each power transfer device has its advantage and limitation. For example, a MOSFET is a voltage-controlled device while a bipolar junction transistor is a current-controlled device which may consume more power. An MOS device is a viable choice for lower voltage DC power transfer while a bipolar device may be selected for high DC voltage switching. Another advantage of a MOSFET for DC power control is its parasitic body diode, i.e., an intrinsic substrate diode from source to drain for a NMOS and from drain to source for a PMOS. When DC switch is turned off, excessive charges at inductive load can dissipate through the intrinsic body diode. An NMOS has a lower on-resistance than a similarly sized PMOS transistor, but often requires an additional charge pump for its operation. Examples of NMOS-FET and PMOS-FET transfer devices are illustrated in the Figures and described below.

The power comparison and fault detection section form a monitoring circuit in the DC switch. In the section, the DC input to the switch is attenuated to compare with a reference voltage, Vref, by a comparator, alternatively referred to herein as an "enable-comparator". If the attenuated DC input to the enable-comparator is higher than Vref, then the output of the enable-comparator becomes high. The output of the enable-comparator and the monitoring status on the operational abnormalities of DC switch, such as over-voltage lockout, junction over-temperature, overcurrent, short circuit, reverse-current or reverse voltage connection, and the like, to ensure free from such abnormalities, are input, for example, to a Boolean AND function, alternatively referred to herein as a "qualifying AND" gate. The output of qualifying AND gate functions as a control signal to control the output enable of DC switch, and its inverted output functions as a qualifier to control the power output at a lower priority DC switch. The reference voltage Vref may be a predetermined voltage or an internally programmable voltage. The Vref may also be applied externally to control the output voltage of DC switch.

In one embodiment, a separate Boolean AND function in the DC switch, alternatively referred to herein as an "enabling AND" gate, receives an activation input to the DC switch as well as the output of the qualifying AND gate. The activation input, a signal referred to herein as PREN, is an enable qualifier from prior, higher priority DC switch. A high at activation input means all higher priority DC switches no longer have sufficient DC powers to their inputs.

The output of the enabling AND gate will be asserted if the output of qualifying AND gate and the activation input PREN signal are both asserted. The assertion of the enabling AND gate means that the DC switch has sufficient DC power for output, that all other high priority DC switches do not have sufficient DC power available, and that no operational abnormality is happening at the DC switch. The assertion of enabling AND gate enables the power transfer device in DC switch to transfer its DC input to switch output.

The activation input signal PREN and the inversion of the qualifying AND gate are input to a third Boolean AND function, referred to herein as a "linking AND" gate, whose output is a linking control signal, i.e., an activation output signal referred to herein as NXEN, which functions as a qualifier to enable a lower priority DC switch to check if there is sufficient DC power for output. If the qualifying AND gate is negated, then its inverted output will cause the linking AND gate to assert the activation output signal NXEN, provided that the activation input PREN is also asserted. The activation output from a DC switch will become the activation input PREN to a lower priority DC switch to check for if there is a new DC power for output. A "low" at the activation output NXEN disables all lower priority DC switches to output power, regardless of whether there is a sufficient DC power connected to any lower priority DC switch or not.

In an embodiment, the enabling AND gate is separated from the qualifying AND gate, where the enabling AND gate is controlled by the qualifying AND gate, and the linking AND gate is controlled by the invert of the qualifying AND gate. Both the enabling AND gate and the linking AND gate receive activation input signal PREN from prior DC switch at its inputs. The output state of the qualifying AND gate determines if the activation input signal PREN will be used to activate the power transfer device of the DC switch, or will be used to activate a link control of a lower priority switch for power output. A 1-to-2 de-multiplex circuit, alternatively referred to herein as a "de-multiplexer", is embedded in the DC switch, which uses the activation input signal PREN as a de-multiplexer input, the qualifying AND gate as the selection control of de-multiplexer, and the enabling AND gate and the linking AND gate as the two outputs of the de-multiplexer.

In other words, the multiplex circuit in the DC switch is controlled by the output of qualifying AND gate and receives the activation input signal PREN as input to generate the linking AND gate and the enabling AND gate two outputs. The outputs of de-multiplex circuit can either enable the DC switch to transfer DC power from its input to switch output or enable a lower priority DC switch to output DC power to the priority chain. As for which DC switch is being enabled, it is determined by the availability of power input to the DC switch, provided that the activation input to the DC switch is asserted. Since the switching at the outputs of 1-to-2 de-multiplexer takes place simultaneously, this ensures a concurrent switching at power transfer devices between two DC switches in power priority chain. A DC switch is named as an "activated switch", if the activation input to the switch is asserted and if there is a sufficient DC power for output.

If the activation input to the DC switch is negated, e.g., at a value "zero", it means at least one higher priority DC power connected to the priority chain has sufficient power to output. On the contrary, if a DC switch detects an asserted activation input, e.g., at a value "one", it indicates all higher priority switches prior to the DC switch do not have sufficient DC power available. Then the DC switch could be either enabled to transfer its DC input to output if there is a sufficient DC power connected to it. If the DC switch detects an asserted activation input but happens not to have sufficient DC power available, then an activation output signal NXEN will be asserted for lower priority DC switches to check for if any switch has sufficient DC power for output. The transition at the de-multiplexer outputs controls the disable and the enable of power transfer devices between an outgoing and an ongoing DC switch in the priority chain, which takes place concurrently with minimal under-voltage glitch during the power switching.

In one embodiment, a basic DC switch without implementing any abnormality protection feature (i.e., there is no qualifier except the enable comparator to detect input power availability) then the qualifying AND gate may be eliminated and the output of enabling comparator may be directly input to both linking AND gate and enabling AND gate, i.e., to function as the de-multiplex circuit control.

The activation input from the prior DC switch and the activation output generated by the DC switch to control the activation of a lower priority DC switch form the linking control section to link a group of DC switches into a power priority chain. As the number of available DC power increases, a DC switch connected to an additional DC power may be inserted in the priority chain at a position consistent with its order in energy cost. The linking control grows linearly as the number of DC switches in the priority chain increases. There is no increase in control complexity, nor any software involvement. Thus, the power priority chain is scalable, and the power transition among the group of DC switches in the priority chain is concurrent and seamless.

In summary, a number of Boolean AND gates are included in the DC switch. It includes, in part, a "linking AND" gate which receives activation input from its prior DC switch to link a set of DC switches in series into a linked AND chain, or a power priority chain. It also includes, in part, a "qualifying AND" gate which detects the operational condition and abnormalities within the DC switch to generate a de-multiplex control signal to control the output switching of an embedded de-multiplexer. In addition, there is an "enabling AND" gate which receives the activation input from the prior DC switch. The linking AND gate and the enabling AND gate are the two outputs driven by the 1-to-2 de-multiplexer in DC switch and the activation input is the input to the de-multiplexer. If the de-multiplex control signal is asserted, then the enabling AND gate is enabled to activate the DC power transfer device in the DC switch. If the de-multiplex control signal is negated, then the linked AND gate will be enabled to assert an activation output for a lower priority switch in the priority chain to check for a DC power for output. If the input to the de-multiplexer is a zero, i.e., the activation input is negated, then all outputs of the de-multiplexer will become zero or inactive, regardless which output is selected by the de-multiplex control signal.

In one embodiment, two types of DC switch, namely type-1 and type-2 DC switches, are disclosed. Each DC switch is connected to a DC power source for power output control, where the type-2 DC switch has additional function to enable a lower priority DC power source just-in-time in advance.

The type-1 DC switch is suitable for applications where DC power connected to DC switch is normally ready when the switch is selected for output, such as the battery power. It is also suitable to connect to solar panels or intermittent DC power sources, such as wind turbines.

A type-2 DC power switch has an additional feature. In one embodiment, it includes an additional Boolean AND function, alternatively referred to herein as an "early AND" gate, which enables a lower priority DC power source to be on in advance just-in-time for a lower priority DC switch to proceed power output.

The early AND gate is controlled by the inverted output of early-enable comparator. The early-enable comparator compares the attenuated DC input to DC switch with a reference voltage, VrefH, which is higher than the reference voltage Vref being input to the enable-comparator. The VrefH may be externally adjustable. Its value could be selected to adapt to the longest turn-on and settlement time for all lower priority DC power sources connected to the lower priority DC switches.

A transition to low at the output of an early-enable comparator will cause the output of early AND gate, alternatively referred to herein as EAREN signal, to be asserted if the PREN is asserted. The assertion of EAREN indicates the DC input to an activated DC switch is at marginal voltage level or is nearly depleted. Thus, a lower priority power source must be initialized and activated in preparation for the lower priority switch to output.

The assertion of the EAREN signal will trigger the next DC power source connected to the lower priority DC switch to turn on. The lower priority DC switch will check if the DC power source input to it is sufficient DC power for output through its enable-comparator. If there is a sufficient DC power input to the lower priority switch, then the DC switch will become an activated DC switch. If not, a new EAREN signal will be continually asserted by the lower priority DC switch to trigger the turn-on of a DC power source next to the lower priority DC power source so that the DC switch next to the lower priority DC switch can check for whether there is sufficient DC power available or not. The search process continues until the priority chain locates a lower priority DC switch that has sufficient DC power for output or until the search reaches the lowest priority DC power source, where there is no power input to any of the DC switches in the entire power priority chain. In such case, the power priority chain will remain idle until a sufficient DC power is available at any input to a DC power switch.

During the initialization of the next DC power source, the DC switch continues to output DC power as long as the attenuated DC input remains higher than Vref. Only when the attenuated DC input to the DC switch falls below Vref, typically after the next DC power source is initialized and is ready for output, then the output of the qualifying AND gate in the activated switch will become low to turn off its power transfer device and to assert NXEN to enable a lower priority DC switch for power output where its DC power source is just turned on.

In an embodiment, in a type-2 DC switch, similar to the type-1 DC switch, the output of the enable-comparator, rather than the output of early-enable comparator, functions as the linking control to generate activation output NXEN to link DC switches into a power priority chain. The activation output NXEN functions an output enable qualifier for the lower priority DC switch is also an enable qualifier to activate a lower priority DC power source connected to the DC switch next to the lower priority DC switch.

In both type-1 and type-2 DC switches, the enabling of DC switch can skip multiple DC switches to activate a lower priority switch for power output. The enabling control can also advance multiple DC switches ahead. In a type-1 DC switch, it does not activate a DC power source in advance. In a type-2 DC switch, the activation input PREN to the DC switch controls the enable of DC power transfer device, the enable to generate activation output and the early enable for a DC power source connected to a lower priority DC switch. However, the DC power source connected to a lower priority DC switch will not be enabled until the power input to the DC switch drops below VrefH. The type-2 DC switch is suitable for controlling the enable of a normally-idle DC power source, such as an idled DC power generator or an AC-to-DC converter receiving input from AC utility power.

In an embodiment, the type-1 and type-2 DC switch may be implemented by using discrete devices. They may be implemented as a stand-alone integrated-circuits. They may be embedded in a power management integrated-circuits (PMIC) or as an internal building block in power circuit devices. When implemented as an integrated-circuits, the DC switch can be widely applied in various power systems that require persistent DC power, as described further below.

BRIEF DESCRIPTION OF DRAWINGS

FIG. 1 shows an exemplary type-1 DC switch which uses a PMOS-FET with embedded de-multiplexing Control, in accordance with one embodiment of the present disclosure.

FIG. 2 shows an exemplary type-1 DC switch which uses an NMOS-FET with embedded de-multiplexing Control in accordance with one embodiment of the present disclosure.

FIG. 3 shows an exemplary type-2 DC switch which uses a PMOS-FET with embedded de-multiplexing Control, in accordance with one embodiment of the present disclosure.

FIG. 4 shows an exemplary type-2 DC switch which uses a PMOS-FET with embedded de-multiplexing Control, in accordance with one embodiment of the present disclosure.

FIG. 5 shows an example of type-2 DC switch which uses a NMOS-FET with embedded de-multiplexing Control, in accordance with one embodiment of the present disclosure.

FIG. 6 shows an exemplary DC power priority chain configured with type-1 DC switches, in accordance with one embodiment of the present disclosure.

FIG. 7 shows an exemplary DC power priority chain configured with type-2 DC switches, in accordance with one embodiment of the present disclosure.

FIG. 8 illustrates an exemplary AC-DC Convertible Power Panel, in accordance with one embodiment of the present disclosure.

FIG. 9 illustrates an exemplary configuration of a persistent dual-DC power module, in accordance with one embodiment of the present disclosure.

FIG. 10 illustrates another exemplary configuration of a persistent dual-DC power module, in accordance with one embodiment of the present disclosure.

FIG. 11 illustrates an exemplary circuit breaker with persistent DC power output, in accordance with one embodiment of the present disclosure.

FIG. 12 illustrates a functional block representation of DC power switch, in accordance with one embodiment of the present disclosure.

DETAIL DESCRIPTIONS

Power multiplexing is commonly seen in electronic products, for example, for compatibility issue or for power saving concerns, where an electronic product may be initialized at a higher voltage and then switched to a lower voltage. The power switching or power multiplexing is mostly between two DC voltages, i.e., to switch between a high and a low voltage. In case more than two voltages are to be multiplexed, a micro-controller is often invoked to control the enabling of a DC voltage for output. In an embodiment, a seamless power switching among a group of DC powers is achieved with an innovative DC switch without the use of an external control device, such as micro-controller. Such a power multiplexing is scalable, which means when more and more DC powers are multiplexed the complexity in the multiplexing control will not increase. Such a power multiplexing provides a cost-effective solution in power usage and is applicable to deliver persistent DC power in a DC ubiquitous environment.

In accordance with one embodiment of the present disclosure, a power priority chain is formed by linking a group of such DC switches in series, where a prior DC switch or a front switch has a higher priority than a tail switch or a rear switch. Typically, the lowest cost DC power source is connected to the first DC switch, which has the highest priority. Each of other available DC powers is connected to a DC switch in the priority chain in an ascending order based on its energy cost. A DC power source connected to the last DC switch is the most expensive one and is the lowest priority power to be used.

In one embodiment, a DC switch to be multiplexed in a power priority chain includes a linking section, a power comparison and fault detection section, a power transfer device, and the power transfer control section, where the linking section and the power transfer control section can be combined as a de-multiplexing circuit controlled by the output of the power comparison and fault status detection section.

The power transfer device in the DC switch may be selected from NMOS Field Effect Transistor or NMOS-FET (NMOS), PMOS-FET (PMOS), bipolar junction transistor (BJT), electromechanical relay (EMR), solid-state relay (SSR), electric-controllable mechanical switch, or even an integrated-circuits (IC), such as an e-fuse. Each power transfer device has its advantage and limitation. For example, a MOSFET is a voltage-controlled device while a bipolar junction transistor is a current-controlled device, which may consume more power. An MOS device is a viable choice for lower voltage DC power transfer while a bipolar device may be chosen for high DC voltage power switching. Another advantage of a MOSFET for DC power control is its parasitic body diode, i.e., an intrinsic substrate diode from source to drain for NMOS and from drain to source for PMOS. When DC switch is turned off, excessive charges at inductive load can dissipate through the intrinsic body diode. An NMOS has a lower on-resistance than a similarly sized PMOS transistor, but often requires an additional charge pump for its continued operation. In the following, only embodiments using a NMOS-FET and/or a PMOS-FET are described.

FIG. 1 is a schematic of an exemplary type-1 DC switch 100, in accordance with one exemplary embodiment of the present disclosure. DC switch 100 is shown as including, in part, a PMOS transistor 130 adapted to control the power transfer from switch 100's input terminal VIN to switch 100's output terminal VOUT. The enabling of PMOS 130 (shown as PMOS-FET 130) is controlled by an enabling-AND gate 115 via NMOS 120 being pulled up by resistor R3 to DC power input VIN. The pull-up inverter formed by R3 and NMOS 120 is adaptive to a wider range of DC voltage input. The inverter function is required for the active-low PMOS-FET 130, but is not required if a NMOS-FET is chosen as the power transfer device in the DC switch.

A link control signal PREN, which is the activation input to the DC switch 100, is input to the enabling AND gate 115 and to the linking AND gate 145. There is a qualifying-AND gate 114 with input connected to a monitoring circuit, which includes an enable-comparator 110 to compare an attenuated VIN input with a reference voltage VREF and various monitoring devices to detect if any operational abnormality takes place in the DC switch 100, such as over-voltage lockout, junction thermal overheat, over-current, reverse current, short circuit, reverse polarity, etc. The inversion of abnormality monitoring results are the other status qualifiers input to the qualifying AND gate 114. The qualifying-AND gate 114 performs a Booleans AND operation of the conditions and abnormalities that may occur within the DC switch 100. The qualifying-AND gate 114 may be removed if user does not require such conditions, in which case the output of enable-comparator 110 may be directly connected to the enabling-AND gate 115.

The activation input PREN, the qualifying AND gate 114, the inverter 140, the enabling AND gate 115, and the linking AND gate 145 form a 1-to-2 de-multiplex circuit, referred to as a de-multiplexer, embedded in the DC switch 100. The activation input PREN is the input to the de-multiplexer. The output of the qualifying AND gate 114 is the de-multiplex control signal. The enabling AND gate 115 and the linking AND gate 145 are the two outputs of the de-multiplexer. Depending upon the state of the de-multiplex control, i.e., the output value of the qualifying AND gate 114, the activation input signal PREN is either output from the de-multiplexer to activate the PMOS-FET 130 in DC switch 100 to enable DC power transfer to the priority chain if the de-multiplex control signal is a high, or is output as an activation output signal NXEN to activate a lower priority DC switch if the de-multiplex control is a low. The assertion of the activation input signal PREN indicates all higher priority DC switches in the priority chain do not have sufficient DC powers for output. In other words, the assertion of the activation input PREN causes the DC switch 100 to check if switch 100 is to be activated, or if to pass the activation control to a next lower priority switch. The action depends on whether the attenuated DC input signal EN/UVLO applied to comparator 110 is higher or lower than a reference voltage Vref. If EN/UVLO is higher than Vref, it indicates a sufficient DC power is available, in which case the DC switch 100 becomes an activated switch to source DC power to the output of priority chain. If EN/UVLO is lower than Vref, it indicates the DC power source is insufficient for output, thereby causing the DC switch 100 to stay idle while the activation output control signal NXEN is asserted for the next lower priority DC switch to check if the next lower priority DC switch shall be activated or skipped.

The voltage divider formed by R1 and R2 attenuates and enables a wider range of DC voltage input to the EN/UVLO terminal of the DC switch 100. The attenuated DC input EN/UVLO functions as an enable qualifier and also as a under-voltage lockout voltage UVLO. When the attenuated VIN drops below Vref, the DC switch 100 is disabled or is locked out. Voltage Vref may be a pre-determined voltage, or an internally programmable voltage. Voltage Vref may also be applied externally to control the output voltage of the DC switch 100.

The qualifying-AND gate 114 performs a Booleans AND operation of the conditions and abnormalities that may occur within the DC switch 100, such as an over-voltage lockout, thermal overheat, over-current, reverse current, short circuit, and the like. The qualifying-AND gate 114 may be removed if not to check such abnormalities, in which case the output of enable-comparator 110 may be directly connected to the enabling-AND gate 115.

Resistor R3 and NMOS 120 perform an inversion operation required for the enabling of PMOS 130. An output buffer 125 connected to the output of enabling-AND gate 115 generates output signal DSON is a status indicator to provide observability on the operation of DC switch 100 and for applications in the parallel connections of DC switches. Signal DSON is on when the DC switch 100 is activated to transfer the DC power.

In one embodiment, signal PREN is supplied from a prior higher priority switch of the priority chain to the DC switch 100, where it is input to the linking AND gate 145 to control the operation of lower priority switches and also input to the enabling AND gate 115 to control the enable of PMOS 130. If PMOS 130 is enabled (activated) for output, then the process of descending the priority chain will be halted. If PMOS 130 is not activated, then the priority chain is traversed in a descending order until a lower priority switch with sufficient DC power is located or until the chain reaches the lowest priority DC power switch. If none of the switches in the chain has sufficient DC power, then the chain would remain idle until a switch in the chain detects a sufficient DC power for transfer.

The power output transition from one switch to another switch in a priority chain takes place concurrently. A switching to low at the output of qualifying-AND gate 114 shuts off an activated NMOS 130 in DC switch 100 and enables a PMOS 130 disposed in a lower priority switch through the assertion of signal NXEN concurrently. Moreover, the power transition among all DC switches in the priority chain takes place automatically without the control of a microcontroller.

FIG. 2 is a schematic diagram of an exemplary type-1 NMOS DC switch 200, in accordance with one embodiment of the present invention. In switch 200, NMOS-FET 230 controls the DC power transfer from switch input VIN to output VOUT, where NMOS-FET 230 is controlled by an enabling-AND gate 215. One input to the enabling-AND gate 215 is connected to the output of qualifying-AND gate 214, where an input of the qualifying-AND gate 214 is connected to the enable-comparator 210, which compares an attenuated input voltage EN/UVLO with a reference voltage Vref. The EN/UVLO is an attenuated voltage of power input VIN divided by resistors R1 and R2. The attenuated input allows a wider range of VIN to be applied to DC switch 200. The second input to the enabling-AND gate 215 is an activation input signal PREN, which is an enabling qualifier from a prior, higher priority DC switch.

As shown, an activation input PREN is also applied to the linking-AND gate 245 to generate a control signal NXEN, namely an activation output. The pair of activation input PREN and activation output NXEN are applicable to link a group of DC switches into a power priority chain. When activation input PREN is negated, it means a higher priority switch in the power priority chain is activated. When activation output NXEN is asserted, the switch activation is transferred to a lower priority DC switch. The transfer of switch activation may skip multiple DC switches forward or backward in the priority chain. The activation input PREN also functions as an input to a 1-to-2 de-multiplex function in the DC switch 200 using the output of qualifying AND gate 214 as the de-multiplex control signal to select either the enabling AND gate 215 or the linking AND gate 245 as an asserted output of the de-multiplex function. The output switching of the de-multiplex function takes place concurrently.

Charge pump 235 is connected to VIN to increase the output voltage of driver 220 to activate NMOS 230 which requires a higher gate voltage than its source voltage. Buffer 225 which receives the output of enabling-AND gate 215 generates an output signal that may be used as a status indicator, among other functions.

In FIG. 2 as the attenuated voltage EN/UVLO falls below reference voltage Vref, the output of comparator 210 will change to low. The output of inverter 240 will become high to assert signal NXEN to activate a lower priority DC switch, if signal PREN is also high. However, in case the DC power input to the DC switch 200 recovers and the attenuated voltage EN/UVLO rises above Vref, a change to high at the enable-comparator 210 output will activate the power transfer device NMOS-FET 230 in the DC switch 200 and negate NXEN to disable any following lower priority DC switch from transferring power to the output of priority chain.

FIG. 3 is an exemplary functional configuration of a type-2 DC switch 300, in accordance with one exemplary embodiment of the present disclosure. In DC switch 300, a PMOS-FET 330 is used to control the DC power transfer from input terminal VIN to output terminal VOUT. Switch 300 includes an additional comparator 340, alternatively referred to herein as an "early-enable" comparator 340, to compare the attenuated DC input EN/UVLO with a reference voltage VrefH, while the enable-comparator 310 compares the EN/UVLO input with voltage Vref. Voltage VrefH is higher than voltage Vref, which may be internally or externally programmable. Similarly, voltage Vref may be an internal pre-determined or an internally programmable voltage. Voltage Vref may also be applied externally to control the output switching voltage. An externally controllable Vref can ensure all DC switches that are connected in the priority chain to have the same Vref voltage input, thereby ensuring all DC switches to switch at the same DC voltage.

In an embodiment, a type-2 DC switch is adapted to perform a just-in-time enabling of a lower priority DC power connected to a DC switch in the priority chain. As the DC power connected to DC switch 300 depletes and its attenuated voltage EN/UVLO falls below VrefH, but is still higher than Vref, then a control output, namely signal EAREN, will be asserted by the DC switch 300 to initialize a lower priority DC power connected to a lower priority DC switch in advance in preparation for the lower priority DC switch to output. In the meantime, the MOSFET 330 of DC switch 300 may still remain on to transfer DC power from VIN to VOUT. When the attenuated input to DC switch 300 drops below Vref, then the MOSFET 330 will be shut off and signal NXEN will be asserted to activate the MOSFET disposed in the lower priority DC switch to source the just turned-on DC power source to output.

The timing difference between the assertion of signal EAREN and the assertion of signal NXEN is determined by the voltage difference between VrefH and Vref. The difference may be chosen to be large enough to cover the longest initialization time among all following lower priority DC power sources connected to the priority chain. A larger voltage difference may be chosen, as it simply turns a lower priority DC power source on earlier than necessary with longer initialization time.

In an embodiment, a de-multiplex function embedded in both type-1 and type-2 DC switches facilitates power switching between two DC switches in a priority chain. The de-multiplex function in a DC switch of higher priority takes precedence over the one in a lower priority DC switch. For example, if a DC switch is transferring a DC power to its output port and suddenly a higher priority DC switch detects sufficient power being available for output, then the de-multiplex function (namely a de-mux) in the higher priority DC switch will become active to disable both outputs of the de-mux function in the DC switch by negating the activation input PREN input to the DC switch.

The early-enable comparator 340 in the DC switch 300 does not take part in the power switching control. The early-enable feature impacts the enable of an idled DC power source connected to a lower priority DC switch. It is the de-multiplex function in a DC switch controls the power switching between any two DC switches in a priority chain, where the next DC switch may have a lower or a higher priority. Because the switching between two DC switches is concurrent, there will be negligible output power overlap, nor output voltage gap, during the switching.

In an embodiment, the activation input signal PREN operates as a dominate control for both type-1 and type-2 DC switches. In the type-2 DC switch 300, the activation input PERN also controls the assertion of the early-AND gate 350. Only when the activation input PREN to a DC switch is asserted, then the power source connected to a lower priority DC switch can be enabled by the output of early-AND gate 350, i.e., EAREN, which is the ANDing of the inverted comparison result of the early-enable comparator 340 with respect to VrefH and the PREN input.

The ANDing of the comparison result of enable-comparator 310 with other abnormality detection results is output to the enabling-AND gate 315. When activation input PREN to the type-2 DC switch is negated, it means a higher priority DC switch has sufficient DC power to output, then both EAREN and NXEN control signals will be negated (de-asserted) to halt the activation of a lower priority DC power and halt the enabling of its associated DC switch. Only at the assertion of signal PREN, i.e., only when all higher priority DC switches run out of power, will the corresponding MOSFET 330 in DC switch 300 be activated to transfer DC power to its output if a sufficient DC power is input to the DC switch 300, as being detected as a high at the output of the enable comparator 310.

When a DC power source is activated with sufficient DC power for a type-2 DC switch to output, both its EAREN and NXEN control outputs will be negated, where EAREN would inhibit its lower priority DC power source from being initialized until the attenuated DC voltage to the DC switch falls below VrefH. Then, a lower priority DC power source will be enabled in preparation for the activation of its associated priority DC switch. When the attenuated DC voltage further falls below Vref, then the associated lower priority DC switch will be activated to output power. Such process will continue until all DC powers connected to the priority chain have been used up.

In the meantime, if any higher priority DC power source receives enough power such that its attenuated DC input reaches Vref, then the corresponding MOSFET in the higher priority DC switch connected to the higher priority DC power source will be turned on to source power to the priority chain. Concurrently, the MOSFET in the lower priority DC switch will be turned off. If the power level at the higher priority DC power source continues to rise such that its attenuated DC voltage reaches VrefH, then the DC power source connected to the lower priority DC switch will be shut off, although it no longer outputs power to the DC priority chain.

Whether or not a DC power source can be turned on in advance, depends upon its prior, higher priority DC switch is a type-1 or type-2 switch. However, a lower priority DC power source behind a type-2 DC switch will not be turned on until the attenuated DC voltage input to the prior type-2 DC switch falls below VrefH. Regardless of a DC switch is a type-1 or type-2, the power transfer device in the DC switch will not be turned on until the attenuated DC voltage at a prior, higher priority DC power source drops below Vref.

In FIG. 3, resistor R3 and the NMOS-FET 320 invert the output of enabling-AND gate 315 to drive the active-low PMOS-FET 330. The intrinsic body diode of PMOS-FET 330 blocks current flow from VIN to VOUT when PMOS-FET 330 is inactive. The intrinsic body diode may also provide a current path for excessive charges at the output load to dissipate through the diode when the PMOS 330 is turned off in the single DC switch application.

FIG. 4 is a schematic diagram of a type-2 DC switch 400, in accordance with one embodiment of the present disclosure. Switch 400 includes a pair of PMOS-FET transistors 430 and 435 to facilitate the DC power transfer from VIN to VOUT. There are advantages to use a pair of MOS-FETs. In FIG. 4, the drain-to-source body diode of PMOS-FET 430 blocks reverse current flow from VOUT back to VIN when DC power source connected to DC switch 400 drops below VOUT. The drain-to-source body diode of PMOS-FET 435 blocks current flow from VIN to VOUT when the transfer gate of DC switch 400 is turned off.

Other exemplary feature, such as an abnormality detection on over-voltage lockout (OVLO) being monitored by overvoltage detector 411, is included in the DC switch 400 for illustration purpose. During normal operation, the attenuated voltage OVLO is typically below Vref. More monitoring on switch operational abnormality, such as MOSFET junction overheat, over-current, reverse connection, short circuit protection, etc., the output of their inversions can be ANDed to the input of qualifying-AND gate 414 to ensure free from any operational abnormalities.

To adapt to a wide range of VIN voltage inputs, a pull-up and transfer gate logic can be used in the DC switch design. In DC switch 400, resistor R6 in series with NMOS transistors 415, 420 form a two-input NAND function in pull-up logic, where resistor R6 sources a pull-up voltage from VIN through the body diode of PMOS-FET 430 to connect to two pull-down NMOS transistors 415 and 420 to form an equivalent two-input NAND gate.

Similarly, an open-drain status output port DSON driven by an open-drain NMOS-FET 455 with an external pull-up resistor R7 is equivalent to an inverter logic. The input to the NMOS-FET 455 is connected to an internal node 429, which when pulled low, activates the pair of PMOS transistors 430 and 435 to conduct DC power transfer.

The status output could be used for observability and other applications. For example, if an application requires to double the VOUT output current, then two DC switches can be connected in parallel, where the DSON of the first DC switch can be connected to the EN/UVLO or the PREN of the second DC switch. Then, when the first DC switch is activated to output DC current, its DSON output will be pulled high to enable the second DC switch to source DC power from VIN to VOUT to double the current output, where the VOUT of both DC switches are connected together. In an embodiment, both type-1 and type-2 DC switches can be linked serially by connecting NXEN of the prior switch to the PREN of the rear switch to extend the length of a power priority chain without increasing its control complexity. That is the priority chain is scalable with any combination of the type-1 and type-2 DC switches. The switches can also be connected in parallel to scale up the output current at any switch node of the power priority chain.

In a legacy DC switch, a single enable control is often adequate to enable the operation of the switch. However, in both type-1 and type-2 DC switches, there are dual enables. The control signal PREN received from a prior, higher priority DC switch is the dominate enable of the DC switch, besides a typical enable control applied to the input port EN/UVLO. The PREN signal can override the EN/UVLO enable in the DC switch 400 to disable the pair of PMOS transistors 430, 435 from being activated even if the associated enable control EN/ULVO is asserted. Moreover, the PREN input signal also controls the enable of all lower priority DC power sources and DC switches through the assertion of ERAEN and NXEN signals.

In an embodiment, both the type-1 and type-2 DC switches include, in part, two sections, i.e., the linking section and the power transfer section. For example, in the DC switch 400, the linking section includes the PREN input, the linking AND gate 460, an inverter 455 connected to the input of the linking AND gate 460, and the output of linking-AND gate 460, i.e., the NXEN signal. The power transfer section includes the enable-comparator 410, the qualifying-AND gate 414, the abnormality monitoring circuit such as the overvoltage detector 411, and the MOS-FET transistors 430, 435 to facilitate power transfer, and its operational support devices R6 and MOSFETs 415,420. The linking section has a higher precedence to override the power transfer section. The linking section can link a set of DC switches into a priority chain, where the front DC switch has a higher priority than the tail DC switch.

A type-2 switch, such as the DC switch 400, also includes an additional just-in-time power enable section to enable a lower priority power source in advance. Such a section includes, in part, an early-enable comparator 440, an inverter 445, and an early-AND gate 450 to generate the control signal EAREN. The assertion of EAREN is determined by whether the attenuated voltage input to the type-2 DC switch 400 has fallen below VrefH or not.

FIG. 5 shows a type-2 DC switch 500, in accordance with another embodiment of the present disclosure. DC switch 500 uses a pair of back-to-back NMOS-FETs 530, 535 to facilitate DC power transfer. If a single DC switch is applied in power output control, then only a MOS transistor may be sufficient to control the power transfer in the switch, with its body diode being placed in an orientation to reversely block the power source from being output when the switch is shut off. However, if an application requires to connect the output of multiple DC switches together, then a DC switch including a pair of back-to-back MOSFETs, as shown in FIG. 5 is a better choice. Otherwise, an additional external diode will be required to block the ORed output voltage from sneaking through the inactive DC switch back to DC power source in case the DC power voltage is lower than the ORed voltage output. Using a pair of MOSFETs in DC switch, as shown in FIG. 5 is an efficient configuration for power applications.

In FIG. 5, similar to FIG. 4, the body diode of NMOS-FET 530 blocks current flow from VOUT to VIN when VIN is lower than VOUT, while the body diode of NMOS 535 blocks current flow from VIN to VOUT when the DC switch is turned off. Charge pump 525 increases the voltage applied to the gate of NMOS-FETs 530, 535, i.e., to raise the output voltage of driver 520 by at least one threshold (VT) above the source voltage of both NMOS transistors 530, 535. The pull-up resistor R4, which is connected to an external interface voltage $V_{LOGIC}$, is coupled to an open-drain NMOS transistor 555 to form an equivalent inverter. The equivalent inverter and the inverter 554 form an output buffer to indicate the status of DC switch 500.

FIG. 6 illustrates an exemplary power transfer system having disposed therein three DC switches (also referred to herein as apparatus) 610, 620, and 630 that are linked together to form a power priority chain 600 so as to provide DC power for use, in accordance with one embodiment of the present disclosure. Three power regulators 603, 604, and 627 are connected to the solar energy 601, the stored DC energy 602 and the wind-turbine power respectively. All input powers are assumed to be ready without a need to initialize in advance when the power source is accessed. In FIG. 6, a simplified NMOS DC switch is chosen for explanation purposes.

Manual switch 605 may be included in the DC priority chain 600 to enable its operation. A micro-controller may be chosen to replace the manual switch 605 instead. When the manual switch 605 is closed, signal NXEN1 is asserted to enable the operation of DC switch 610. If there is a sufficient energy input to the DC switch 610, its MOSFET will be enabled to transfer the DC input from regulator 603 to the switch output. If the attenuated voltage input to DC switch 610 falls below Vref, the MOSFET in DC switch 610 will be shut off while the MOSFET in a lower priority switch, such as the one in DC switch 620, will be turned on, assuming that a sufficient DC power is input from the DC-DC converter, i.e., the voltage regulator 604 to the DC switch 620.

The concurrent switching between the DC switches 610 and 620 enable a steady and uninterrupted power output is available under the control of the de-multiplex function, which is implemented by three AND gates in the higher priority DC switch 610 in this example, where the output of qualifying-AND gate in the DC switch 610 functions as the de-multiplex control to activate either the enable-AND gate, which controls the enable of MOSFET in DC switch 610, or to activate the linking-AND gate, which controls the enable of MOSFET in the lower priority DC switch 620, depending on if the attenuated power input to the DC switch 610 is higher or lower than Vref.

The attenuated voltage input to DC switch 610 determines if the DC power to be output to the power priority chain will be either from the DC switch 610 or from a lower priority DC switch, such as DC switch 620. In case the DC power source connected to DC switch 620 is unavailable, then the search for a valid power source would continue on to another lower priority DC power source until the search reaches a first lower priority DC power source that has sufficient power available, which may be the power source connected to the DC switch 630 in the example of FIG. 6. In the meantime, if any higher priority DC power source become available, then its associated DC switch will be activated to source power for the priority chain and concurrently to switch off power output from the lower priority DC switch. Thus, only one DC switch is enabled at a time in normal condition and a higher priority, lower cost DC power source always takes precedence as the output power. Thus, the DC power priority chain would provide a most cost-effective DC power output from a multiple of DC power sources. The ORed DC output of the power priority chain 600 can be connected to a DC-DC converter or DC regulator 650 to generate one or more DC output voltages, such as V1 and V2 for devices to use as shown in FIG. 6.

FIG. 7 shows another exemplary power transfer system having disposed therein a number of type-2 DC switches 750, 760, 770 and 780 thereby to form a power priority chain 700. Each stage in the DC power priority chain 700 includes a DC power source and a DC power switch. The prior or front stage has a higher priority than the rear stage to provide DC power. The DC power sources connected to DC switches in lower priority stages are normally inactive or in idle state.

For a DC power source to be enabled just-in-time, a type-2 DC switch shall be selected as its prior DC switch in the priority chain. When the DC power input to the prior DC switch is nearly depleted (i.e., when the attenuated voltage of the higher priority DC power source falls below VrefH), then the DC power connected to the DC switch would be turned-on, just-in-time, in preparation for the DC switch to source power. This minimizes energy waste when a DC power source is not in use. When the DC switch in the prior higher priority stage detects its attenuated DC input continuously to drop below the Vref threshold, then the de-multiplex control in the prior higher priority DC switch will enable the DC switch in current stage to output DC power, if there is sufficient DC power source to it.

Referring to the exemplary embodiment shown in FIG. 7, the priority chain 700 may be enabled to operate by a manual switch 749 or by an external micro-controller. In FIG. 7, the frontmost type-2 DC switch 710 is directly powered by a DC regulator 715 if the manual switch 749 is switched on. When the power from DC regulator 715 is nearly used up, being determined by the change to low at the comparison output of its early-enable comparator 752 with respect to VrefH1, then the DC regulator 726 is turned on to power the DC switch 760. When the DC power sourced by the DC regulator 726 is nearly depleted and its attenuated output voltage falls below VrefH2, then the normally-open (NO) AC switch 731 will be switched-on to enable the AC utility power 730 to power the AC-DC converter 735 until the converted DC output is stabilized and ready for the DC switch 770 to use.

Similarly, in case the AC power 730 is shut off, then a backup power generator 740 may be turned-on when the attenuated DC output from AC-DC converter 735 falls below VrefH3. The values of VrefH1, VrefH2 and VrefH3 may be different. In one embodiment, the VrefH value is determined by the depletion rate of its DC power source. A faster voltage drop in DC power output may require a larger voltage difference between VrefH and Vref.

The DC generator 740 may also be activated when a prior, higher priority DC switch 770 enables it to be on. Here, the initialization time of DC generator 740 may be longer than the power drop-off time of AC utility power. If necessary, an energy storage device 736, such as a super-capacitor pack or a battery, may be connected at the output of DC power source, i.e., at the output of the AC-DC converter 735, to slow down the ADC output voltage drop and to ensure the voltage difference between VrefH and Vref is enough for a lower priority DC power to be ON and ready. A type-1 DC switch may be chosen as the last DC switch 780 in the priority chain 700, as there is no more lower priority DC power source to be enabled.

In one embodiment, a manual switch 749 at the front end initiates the operation of the priority chain 700. Before the manual switch 749 is closed, the pull-down resistor R0 disables all DC switches linked in the priority chain 700. The AND gates 751, 761, 771, 781 from respective DC switch 750, 760, 770, 780 are linkable into an AND chain. The order of linking determines the priority of DC switch and its associated energy source in the priority chain. In the example, the solar panel 710 has the highest priority, followed by other DC energy source 720, then the DC power converted from the AC utility Input 730, and finally the regulated power from DC generator 740. The output of the early AND gate controls the enable of the next lower priority DC power source. The output of linking AND gate, i.e., the activation output, controls the enable of the next lower priority DC switch. If the next DC power source is also unavailable, then the output of the linking AND gate at the next lower priority DC switch will be asserted to enable the DC power source after the next lower priority DC power source in the priority chain to check for if there is DC power available for output.

The AND chain selects and enables a most cost-effective DC power in the power priority chain 700 for output. Advantageously, no micro-controller is required to enable a DC switch among a group of DC switches to output power. In accordance with embodiments of the present disclosure, the enabling of a DC power source and the power switching between any two DC switches in the entire DC power priority chain take place automatically, un-interruptedly, and seamlessly by a de-multiplex function embedded in the higher priority DC switch to facilitate the concurrent power transition.

The NMOS transistors shown in FIG. 7 are simply for illustration purposes. For example, the charge pump associated with the NMOS transistors are not shown. As shown in FIG. 7, the blocking diodes 759, 769, 779, and 789, are connected to the outputs of DC switches 750, 760, 770, and 780 respectively for the case where only a single MOSFET device is used for DC power transfer. Using a DC switch with back-to-back MOSFETs has its advantage without requiring to connect a blocking diode at the power output of each DC switch.

FIG. 8 shows a convertible power panel 800, which can be configured either as an AC power panel or as a DC power panel. The panel, as shown, includes six connection contacts SN, A1, A2 and SG, B1, B2. To configure as an AC power panel, three power cables can be placed to connect SN, A1, A2 with SG, B1, B2 respectively inside the convertible power panel 800. To configure as a DC power panel, a persistent power add-on unit 830 may be installed in the convertible power panel 800. Or, the persistent power add-on unit 830 may be configured as an external add-on unit with its AC power input terminals connected to SN, A1 and A2, and with its output terminals connected to SG, B1 and B2. In addition, in the example two DC power inputs V1, V2 are connected to the persistent power add-on unit 830 to source dual-DC powers from the convertible power panel 800 to be an exemplary persistent dual-DC power module 832.

The DC power sources 820 shown in FIG. 8 may include regenerated DC energies and battery stored energy in the DC power source for input to the DC power priority chain 825 adapted to select and output the most cost-effective DC power to the DC-DC converter/regulator 831 to generate regulated DC voltages, V1 and V2 as in the example of FIG. 8. The persistent power add-on unit 830 is the AC utility power stage being a partitioned segment from the DC power priority chain 700 shown in FIG. 7, but without the DC power generator. The partitioned segment constitutes a persistent DC power add-on unit installable in various DC power systems.

FIG. 9 shows an exemplary configuration of a persistent dual-DC power module 900 for plugging into a convertible power panel to provide dual persistent DC powers, in accordance with one embodiment of the present disclosure. In the persistent dual-DC power module 900, two single-DC power modules of different implementations are shown, where the single-DC power module 910 is implemented by discrete components and the single-DC power module 950 is implemented using a type-2 DC switch 960 and type-1 DC switch 980. Two different approaches illustrate the potential variations in the single-DC power module design. If necessary, more single-DC power module may be included to form a multiple-DC power module to meet the requirements of applications.

The discrete design of single-DC power module 910 includes, in part, an AC switch control comparator 920, an embedded AC switch 915, an analog-to-digital converter (ADC) 930, an output control comparator 935, a power multiplexer (mux) 940, and a DC regulator 945. A DC regulator, DC power regulator, DC-DC regulator, DC-DC converter, or a DC converter may be used interchangeably in various embodiments of the present disclosure.

In the single-DC power module 910, if the DC voltage input DV1 is sufficiently high, the power mux 940 will select the DV1 input to the output of mux 940, regulated by DC regulator 945 to become the output of single-DC power module 910. However, if the attenuated voltage of DC input DV1 drops below Vrefa (as detected by the AC switch control comparator 920) then a normally-open embedded AC switch 915 will be closed to source AC power to initialize and power up an AC-DC converter, or ADC 930. When the attenuated voltage of the ADC 930 output rises above Vrefo, the output control comparator 935 will change to high to select the output of ADC 930 as the output of power mux 940 to drive DC regulator 945. However, if the external voltage DV1 increases (and its associated attenuated input rises above Vrefa) then a change to a high level at the output of AC switch control comparator 920 will shut off the AC switch 915 and the pull-down at the input of the output control comparator 935 will cause the power mux 940 to re-select DC input DV1 to the mux output to drive DC regulator 945. In one embodiment, the AC switch control comparator 920 detects the falling of DC input voltage DV1, while the output control comparator 935 detects the rising of output voltage of ADC 930 to control the operation of the DC power switch 910.

In one embodiment, a different single-DC power module 950 may be implemented by using of a pair of type-2 DC switches, or by a type-2 DC switch 960 followed by a type-1 DC switch as shown in FIG. 9. In the exemplary implementation, the type-2 DC switch 960 is connected to an external DC power source DV2. When the manual switch 964 is closed, signal PREN applied to the type-2 DC switch 960 is asserted. If a sufficient DV2 input is available, then the assertion of enable-comparator 967 in the type-2 DC switch 960 will enable its MOSFET 975 to transfer the DV2 input to DC voltage regulator 985 and negate the NXEN output to disable the lower priority type-1 DC switch 980. However, if the DC input DV2 continues to drop with its attenuated voltage falling below VrefH (as detected by the early-enable comparator 965) then the embedded AC switch 966 will be turned-on to initialize ADC 970.

It is noted that using single MOSFET 975 as power transfer device in the single DC power module 950 is only for illustration purpose. A pair of back-to-back MOSFETs may be used when multiple DC switches are ORed together. Alternatively, a Schottky diode may be used at the output of each DC switch to block reverse-current from the ORed output if single MOSFET is chosen as the power transfer device. The embedded AC switch may be a solid-state relay (SSR) which can be switched on/off at AC power zero-crossing. If the attenuated DC voltage input to DC switch 960 continues to drop below Vref (as detected by the enable comparator 967) then the MOSFET 981 in the DC switch 980 will be turned-on to transfer the ADC 970 output to the DC regulator 985.

The implementation of the single-DC power module 950 by using DC switches 960 and 980 is representative as part of the DC power priority chain 700 shown in FIG. 7. It is seen if the DC switches 760, 770, and the section of AC utility power 730 source are grouped and extracted from the DC power priority chain 700 in FIG. 7, it becomes the single DC power module 950 shown in FIG. 9. In FIG. 7, the solar panel 710, other regenerated DC energy source 720, battery 725 and related DC power regulators 715 and 726 may be grouped and incorporative under the control of a type-1 DC switch, rather than a type-2 DC switch 750. The manual switch 964 in the single-DC power module 950 breaks the linkage of DC power priority chain 700 into two segments. The DC generator 740 in DC power priority chain 700 is optional. It is included in the priority chain 700 for illustration purpose.

The DC power priority chain 700 shown in FIG. 7 may be partitioned or segmented differently when configuring a persistent DC power system. FIG. 10 shows another exemplary configuration of a persistent dual-DC power module 1000, where two single-DC power modules of different implementations are also depicted for comparison purpose. The single-DC power module 1010 is implemented by using discrete components, and the single-DC power module 1050 is implemented by using a single type-2 DC switch 1060. The single-DC power module 1010 implemented in discrete components includes, in part, an AC switch control comparator 1020, a normally-open AC switch 1015, an ADC 1030, an output control comparator 1035, a power mux 1040, and a DC regulator 1045. In the discrete design, the attenuated DC input DV1 is monitored by the AC switch control comparator 1020 with respect to a reference voltage Vrefa, and also monitored by the output control comparator 1035 with respect to a reference voltage Vrefo. The voltage Vrefa is higher than voltage Vrefo.

If the DC voltage input DV1 to the DC power module 1010 is sufficiently high, the power mux 1040 in the power module 1010 will select DV1 as output to the power mux 1040 due to a high at the output of output control comparator 1035, where the mux output may be regulated by a DC regulator 1045. But when the attenuated voltage of DV1 input falls below Vrefa, the output of AC switch control comparator 1020 will close the normally-open AC switch 1015 to initialize ADC 1030 in advance in preparation for output use. If the DC input DV1 further drops (its attenuated voltage falls below Vrefo as detected by the output control comparator 1035) then a low voltage level at the comparator 1035 output will cause the output of ADC 1030 to be selected for output to power mux 1040 to source the DC regulator 1045. However, if the DC voltage input DVI to the single-DC power module 1010 increases (its attenuated input rises above Vrefo), then a high at the output of output control comparator 1035 will cause the power mux 1040 to select the external DC input DV1 as output of power mux 1040 to drive the DC regulator 1045.

The type-2 DC switch 1060 in the single-DC power module 1050 operates in a similar manner, where VrefH is higher than Vref and NMOS-FET 1075 is chosen for power transfer in the example. If the attenuated voltage of DC input DV2 is above Vref, the output of enable-comparator 1067 will be asserted to enable the NMOS-FET 1075 to transfer DV2 to the output of DC voltage regulator 1085. When the attenuated voltage of DV2 drops below VrefH as detected by the early-enable comparator 1065, then the normally-open embedded AC switch 1066 will be closed to source AC power to ADC 1070. The embedded AC switch may be a solid-state relay. As the DV2 further drops with its attenuated input falling below Vref, then the enables for the pair of AND gates 1068 and 1069 will switch, under the control of enable-comparator 1067, to disable the NMOS-FET 1075 and to assert NXEN to enable the NMOS-FET 1080 so that the output of ADC 1070 will power the DC regulator 1085. Similarly, as the DV2 input to the type-2 DC switch 1060 recovers and increases (as monitored by the enable-comparator 1067), it will cause the enables of the NMOS transistors 1075 and 1080 to switch again. Single MOSFET is shown for illustration purpose. Typically, back-to-back MOSFETs would be used for MOSFET 1075 and 1080. Although not shown, a charge pump is normally required for the NMOS-FETs here.

A single-DC power module 1010 may be implemented using a single type-2 DC switch 1060 as shown in the configuration of single-DC power module 1050. Manual switch 1064 functions as activation input PREN to the type-2 DC switch 1060 in the example. The close of manual switch causes the activation input PREN to DC switch 1060 asserted. The type-2 DC switch 1060 becomes active when a sufficient DC power DV2 is input to the switch 1060, where output of enable comparator 1067 will be asserted to transfer the DC input DV2 to the DC switch output port by MOSFET 1075 to drive DC regulator 1085.

In the implementation of DC power module 1050 by using single DC switch 1060, the three 2-input AND gates in the type-2 DC switch 1060 have a value "one" at their PREN input through the manual switch 1064. A Boolean equivalent of the DC power module 1050 becomes the same as the DC power module 1010 with logic minimization, where the early-enable comparator 1065 in DC module 1050, which compares the attenuated DC input with respect to VrefH, is the same as the AC switch control comparator 1020 in DC module 1010, which compares the attenuated DC input with respect to Vrefa. Similarly, the enable comparator 1067, which compares the attenuated DC input with respect to Vref, is the same as the output control comparator 1035, which compares the attenuated DC input with respect to Vrefo.

The single DC power module 950 in FIG. 9 and the single DC power module 1050 in FIG. 10 may be selected for use in an AC-DC convertible power panel or an AC-DC co-existent power panel. Both modules may also be selected for use in a circuit breaker assembly, including a DC circuit breaker, a co-existing AC-DC circuit breaker, and power equipment or assemblies that requires one or more persistent DC powers.

FIG. 11 shows an exemplary circuit breaker capable of providing one or more persistent DC powers. The circuit breaker 1100 in the example is connected to an AC utility power input 1101 and a DC power source 1102. The DC power source 1102 may be an output from a power priority chain connected to solar panel, regenerated DC power sources and battery, and the like. The AC manual switch 1110 controls the AC power input and the DC manual switch 1120 controls the input of DC power source 1102.

The exemplary circuit breaker 1100 includes, in part, a persistent DC power module 1130, which is connected to one or two phase-lines from the AC manual switch 1110 and is also connected to the output of DC manual switch 1120. Depending upon the number of persistent DC powers to be output from the circuit breaker 1100, one or more modules with single persistent DC power output, such as the single DC power module 950, 1050 shown in FIG. 9 and FIG. 10, may be included in the persistent DC power module 1130 included in the circuit breaker 1100. A DC-DC converter may be connected at the output of a single module to generate multiple-DC voltages at the converter output to meet the needs of multiple DC requirements.

FIG. 12 is a functional block representation of a DC power switch 1200. It includes a control section 1201, a switching and linking section 1202, an output driver section 1203, and an optional supplemental enable section 1204. The control section 1201 includes, in part, an enable-comparator 1210 to check for the status of DC power input VIN connected to the DC switch 1200, and a monitoring circuit 1205 which may include various monitors and detectors 1215, such as temperature sensor for over-temperature detection, comparator for over-voltage detection, and the like to check for operational abnormality. The control section 1202 in DC switch 1200 may also include a Boolean Qualifying AND gate 1220, which takes the output of enable-comparator 1210 and the status output from the monitoring circuit 1205 as its inputs to generate a control signal to control the output switching of a 1-to-2 de-multiplexer 1225 in the switching and linking section 1202. The de-multiplexer 1225 receives signal PREN as its input and uses the output of qualifying AND gate 1220 to determine if to transfer the activation output control to a lower priority DC switch by asserting a NXEN interface signal or to enable the power transfer device 1235 in the output driver section 1203 to transfer DC power input VIN to the output port VOUT.

The power transfer device 1235 can be NMOS-FET, PMOS-FET, bipolar junction transistor, solid-state relay, electromagnetic relay, and so on. A driver logic 1230 in the output driver section may include slew rate control if the VIN input to the DC switch 1200 is not pre-regulated, or may include a current limiter for the output current if it is over-range. It may also include a charge pump to raise the gate voltage to the NMOS power transfer device above its source voltage, or to inverter the driver logic output voltage for an active-low PMOS power transfer device.

An optional supplemental enable section 1204, which mainly includes a supplemental enable comparator 1240 to compare an attenuated DC voltage input with a supplemental reference voltage VrefS, may be used to control just-in-time early enable of a lower priority power source to minimize energy waste. In this case the VrefS will be higher than the reference voltage Vref being applied to the enable comparator 1210. However, it does not require VrefS to be higher than Vref all the time. The supplementary enable section 1204 can function as a second power control feature being incorporated in the DC power switch 1200 to control the enable of a separate set of power device, even if the power transfer device 1235 in the DC switch 1200 is shut off, i.e., the attenuated DC input to the DC switch 1200 is below Vref. However, the operation of the separate set of power device is still under the control of signal PREN, which is a dominate or a highest enable to the DC switch 1200 to control the operation of the priority chain and the function of a separate set of power device.

The VrefS can be higher or lower than Vref. If the VrefS is lower than Vref, the separate set of power device controlled by the supplement enable control signal, or SUPEN, can be still functioning even if the DC switch is no longer enabled to source DC input to the priority chain output, provided that the highest enable PREN is asserted. A DC switch includes such an optional section means there is an additional power control feature.

In the DC switch 1200, the Vref is an interface input, which can be controlled externally. With an externally controllable Vref, all DC switches in a priority chain can have the same Vref input to ensure all DC switches in the priority chain would switch at the same DC output voltage. However, it is the de-multiplexer 1225 that links the DC switches into a priority chain and enables concurrent switching between any two DC switches in the priority chain.

In one embodiment, both type-1 and type-2 DC switches may be implemented by using discrete devices. The switches may be implemented as integrated circuits (IC) fabricated on a substrate. They may be embedded as an internal circuit block in a power management IC or similar power chips. The DC switch as an integrated circuits is applicable in various power assemblies that require persistent DC power, such as in a DC circuit breaker, an AC-DC convertible power panel, an AC-and-DC co-existing power panel, and DC power equipment. The DC switch may also be placed in parallel by using the output status indicator (DSON) at the DC switch 1200 to increase output current, if higher DC power is required.

The DC switch is linkable to form a priority chain to select a most cost-effect DC power for output automatically without using an external micro-controller. The de-multiplexing function in both type-1 and type-2 DC switches simplifies the power switching control in the priority chain with minimal switching glitches during power transition between DC switches. The additional power control feature, such as the one for just-in-time early enable in the type-2 switch, could minimize power waste when the power resource is not in use.

The invention claimed is:

1. A power transfer system comprising a first apparatus adapted to transfer power, the first apparatus comprising:
    a DC input port coupled to a DC power source;
    a DC output port;
    a power transfer device;
    a monitoring circuit which monitors operational status of the first apparatus and generates a monitoring output signal in response;
    a de-multiplexing circuit adapted to perform:
        a Boolean AND operation of the monitoring output signal and an activation input signal, received via an activation input port, to generate an enable control signal for the power transfer device, and
        a Boolean AND operation of an inverse of the monitoring output signal and the activation input signal to generate an activation output signal for a power linking control, wherein the power transfer device is disabled and the activation output signal is negated when the activation input signal is negated.

2. The system of claim 1 wherein a DC voltage coupled to a DC power received from the DC power source is applied to the monitoring circuit.

3. The system of claim 2 wherein the monitoring output signal is generated in response to a first comparison signal generated by a first comparator comparing the DC voltage with a first reference voltage.

4. The system of claim 3 wherein the monitoring output signal is generated by a Boolean AND operation of the first comparison signal and a status signal representative of free from over-voltage, over-current, short-circuit, reverse current and over-temperature conditions in the first apparatus.

5. The system of claim 4 wherein the enable control signal is asserted to transfer the DC power source to the DC output port when the activation input signal and the monitoring output signal are asserted, and the DC voltage is no less than the first reference voltage.

6. The system of claim 4 further comprising:
    a second comparator adapted to compare the DC voltage with a second reference voltage to generate a second comparison signal, wherein the first apparatus is further configured to perform a Boolean AND of an inverted second comparison signal with the activation input signal to generate an external power control signal.

7. The system of claim 6 further comprising a second apparatus, wherein the activation output signal of the first apparatus is applied to the activation input port of the second apparatus so as to form a priority chain, wherein the first apparatus has a higher priority than the second apparatus in supplying power to the priority chain.

8. The system of claim 7 further comprising N more apparatus, wherein the activation output signal of the second apparatus is applied to an activation input port of a first one of the N apparatus, and wherein an activation output signal of $(N-1)^{th}$ apparatus is applied to an activation input port of the $N^{th}$ apparatus forming the priority chain.

9. The system of claim 7 wherein the external power control signal of the first apparatus is asserted to couple the DC power source to the second apparatus when the activation input signal of the first apparatus is asserted and the DC voltage to the second comparator is lower than the second reference voltage, wherein the second reference voltage is higher than the first reference voltage.

10. The system of claim 9 wherein the enable control of the first apparatus is asserted to transfer the DC power source to the DC output port of the first apparatus when the activation input signal and the monitoring output signal of the first apparatus are asserted, and when the DC voltage to the first comparator is no less than the first reference voltage.

11. The system of claim 7 wherein when the DC voltage to the first comparator of the first apparatus drops below the first reference voltage and the monitoring output signal of the first apparatus changes from assertion to negation, a concurrent switching takes place thus causing:
    the enable control signal of the first apparatus to be disabled to disconnect the DC power source from the first apparatus, and
    the activation output signal to the second apparatus to be asserted to enable the power transfer device in the second apparatus to output power to the priority chain when the DC voltage to the first comparator of the second apparatus is no less than the first reference voltage.

12. The system of claim 7 wherein the de-multiplexing circuit of the first apparatus controls concurrent switching to disable the power transfer device of the first apparatus and enable the power transfer device of the second apparatus when
    the monitoring output signal of the first apparatus changes from assertion to negation in response to the DC voltage received by the first apparatus dropping below the first reference voltage.

13. The system of claim 7 wherein the de-multiplexing circuit of the first apparatus controls concurrent switching to enable the power transfer device of the first apparatus and to disable the power transfer device of the second apparatus when
    the monitoring output signal of the first apparatus changes from negation to assertion in response to the DC voltage received by the first apparatus rising to no less than the first reference voltage.

14. The system of claim 7 wherein the first apparatus is activated when the activation input signal of the first apparatus is asserted and the DC voltage received by the first apparatus is above the first reference voltage, and
    wherein the first apparatus is deactivated and does not supply power to the priority chain when the activation input signal of the first apparatus is negated.

15. The system of claim 9 wherein the system further comprises a persistent DC power module, wherein the DC output ports of the first apparatus and the second apparatus are coupled to an output port of the persistent DC power module to generate a regulated voltage, wherein
  the external power control signal of the first apparatus is coupled to a normally-open (NO) AC switch to power an AC-DC converter (ADC) when the DC voltage applied to the first apparatus drops below the second reference voltage, wherein an attenuated voltage from output of the ADC is coupled to the first comparator of the second apparatus to enable the power transfer device of the second apparatus when the DC voltage received by the second apparatus is no less than the first reference voltage, and
  wherein the persistent DC power module is activated when the activation input to the first apparatus is asserted.

16. The system of claim 9 wherein the persistent DC power module is disposed in one or more of an AC-DC conversion power panel, a circuit breaker, and a persistent DC power assembly.

17. The system of claim 6 further comprising a persistent DC power module, wherein the DC output port of the first apparatus and an output port of an external power transfer device are coupled to an output port of the persistent DC power module to generate a regulated voltage, wherein
  the external power control signal of the first apparatus is coupled to a normally-open (NO) AC switch to power an AC-DC converter (ADC) when the DC voltage applied to the first apparatus drops below the second reference voltage, wherein an output of the ADC, which is coupled to an input port of an external power transfer device, is enabled to output power to the persistent DC power module when the activation output signal of the first apparatus is asserted, and
  wherein the persistent DC power module is activated when the activation input signal of the first apparatus is asserted.

18. The system of claim 17 wherein the persistent DC power module is disposed in one or more of an AC-DC conversion power panel, a circuit breaker, and a persistent DC power assembly.

19. The system of claim 1 wherein the enable control signal is coupled to a status output port of the first apparatus.

20. The system of claim 19 wherein the status output port provides observability on operation status of the first apparatus.

21. The system of claim 19 wherein the enable control signal from the status output port of the first apparatus is coupled to the activation input port of at least a second one of the first apparatus disposed in the system to increase power output from the system.

22. The system of claim 1 wherein the DC voltage is an attenuated voltage of the DC power received from the DC power source.

23. The system of claim 1 wherein the first reference voltage is internally generated.

24. The system of claim 1 wherein the first reference voltage and the second reference voltage are external to and received by the first apparatus.

25. The system of claim 1 wherein the power transfer device is selected from a group consisting of
  a single NMOS field-effect transistor (FET),
  a single PMOS-FET,
  a pair of back-to-back NMOS-FETs,
  a pair of back-to-back PMOS FETs,
  a bi-polar junction transistor,
  a solid-state relay (SSR),
  an electromagnetic relay (EMR), and
  an e-Fuse integrated circuits.

26. The system of claim 1 wherein the apparatus is formed using discrete devices.

27. The system of claim 1 wherein the apparatus is an integrated circuit (IC) chip.

28. The system of claim 1 wherein the system is disposed in one or more power management integrated circuits.

29. A system adapted to transfer power, the system comprising:
  a plurality switches arranged in a hierarchy to form a link, each switch associated with and receiving power from a different one of a plurality of DC power sources, each switch comprising:
    an input terminal adapted to receive the associated power;
    an input control signal which when asserted indicates that one or more switches having a priority higher than a priority of the switch do not have sufficient DC power;
    a comparator adapted to compare a voltage representative of the power received by the switch to a reference voltage in response to the assertion of the input control signal;
    a power transfer device adapted to transfer the power received at the input terminal to an output terminal of the switch if the voltage representative of the power received by the switch is detected by the comparator to be no less than the reference voltage; and
    an output signal that is asserted if the voltage representative of the power received by the switch is detected by the comparator to be less than the reference voltage, wherein the output signal of the switch is coupled to the input control signal of a next switch in a descending order of hierarchy.

* * * * *